United States Patent
Inomata et al.

(10) Patent No.: US 12,123,900 B2
(45) Date of Patent: Oct. 22, 2024

(54) POWER CONVERSION DEVICE, TEMPERATURE ESTIMATION METHOD, AND NON-TRANSITORY COMPUTER READABLE STORAGE MEDIUM WITH AN EXECUTABLE PROGRAM RECORDED THEREON

(71) Applicant: KABUSHIKI KAISHA YASKAWA DENKI, Kitakyushu (JP)

(72) Inventors: Kentaro Inomata, Kitakyushu (JP); Noor Aamir Baloch, Kitakyushu (JP); Tokuma Nakamichi, Kitakyushu (JP); Hengbin Rui, Kitakyushu (JP)

(73) Assignee: KABUSHIKI KAISHA YASKAWA DENKI, Kitakyushu (JP)

( * ) Notice: Subject to any disclaimer, the term of this patent is extended or adjusted under 35 U.S.C. 154(b) by 597 days.

(21) Appl. No.: 17/443,998

(22) Filed: Jul. 29, 2021

(65) Prior Publication Data
US 2022/0034949 A1 Feb. 3, 2022

(30) Foreign Application Priority Data

Jul. 31, 2020 (JP) .................................. 2020-130938

(51) Int. Cl.
*G01R 21/06* (2006.01)
*G01K 7/22* (2006.01)
(Continued)

(52) U.S. Cl.
CPC .............. *G01R 21/14* (2013.01); *G01K 7/22* (2013.01); *G01K 7/427* (2013.01); *G01K 13/00* (2013.01);
(Continued)

(58) Field of Classification Search
CPC .......... G01R 21/14; G01R 21/06; G01K 7/22; G01K 7/427; G01K 13/00; H02P 27/06;
(Continued)

(56) References Cited

U.S. PATENT DOCUMENTS 7,035,064 B2 * 4/2006 Schimanek ........ H03K 17/0822
361/33
2003/0214770 A1 * 11/2003 Schimanek ........ H03K 17/0822
361/100
(Continued)

FOREIGN PATENT DOCUMENTS

JP 2011-036095 A 2/2011

*Primary Examiner* — Nathaniel T Woodward
*Assistant Examiner* — Philip L Cotey
(74) *Attorney, Agent, or Firm* — Oblon, McClelland, Maier & Neustadt, L.L.P.

(57) ABSTRACT

A power conversion device includes a power conversion circuit including a temperature sensor configured to detect a temperature at a sensor position and a switch configured to switch a connection on and off at a switch position separated from the sensor position; a loss calculation processing circuitry configured to calculate a power loss in the switch; a loss correction processing circuitry configured to correct a calculation result of the power loss on the basis of a detection result of the temperature at the sensor position; a temperature correction processing circuitry configured to correct the detection result of the temperature on the basis of the calculation result of the power loss; and a temperature estimation processing circuitry configured to estimate a temperature at the switch position on the basis of a corrected calculation result of the power loss and a corrected detection result of the temperature.

16 Claims, 13 Drawing Sheets

(51) Int. Cl.
*G01K 7/42* (2006.01)
*G01K 13/00* (2021.01)
*G01R 21/14* (2006.01)
*H02P 27/06* (2006.01)
*H02P 27/08* (2006.01)
*H02P 29/68* (2016.01)
*G05F 3/02* (2006.01)
*H02M 1/00* (2006.01)
*H02M 1/32* (2007.01)
*H02M 5/293* (2006.01)
*H02M 5/458* (2006.01)
*H02M 7/00* (2006.01)
*H02M 7/5387* (2007.01)
*H02P 21/22* (2016.01)

(52) U.S. Cl.
CPC .............. *G01R 21/06* (2013.01); *H02P 27/06* (2013.01); *H02P 27/08* (2013.01); *H02P 29/68* (2016.02); *G05F 3/02* (2013.01); *H02M 1/00* (2013.01); *H02M 1/327* (2021.05); *H02M 5/293* (2013.01); *H02M 5/458* (2013.01); *H02M 7/003* (2013.01); *H02M 7/53871* (2013.01); *H02P 21/22* (2016.02)

(58) Field of Classification Search
CPC .......... H02P 27/08; H02P 29/68; H02P 21/22; H02M 1/00; H02M 1/327; H02M 5/293; H02M 5/458; H02M 7/003; H02M 7/53871
See application file for complete search history.

(56) References Cited

U.S. PATENT DOCUMENTS

| | | | |
|---|---|---|---|
| 2011/0210713 A1* | 9/2011 | Kazama | H02M 7/53875 323/311 |
| 2012/0217795 A1* | 8/2012 | Hasegawa | H02M 7/48 307/9.1 |
| 2012/0306564 A1* | 12/2012 | Thome | H05B 6/06 327/512 |
| 2013/0249460 A1* | 9/2013 | Sugahara | H05K 7/20945 363/55 |
| 2013/0301326 A1* | 11/2013 | Zoels | H01L 27/0248 327/108 |
| 2013/0317664 A1* | 11/2013 | James | H02P 29/68 700/299 |
| 2014/0042948 A1* | 2/2014 | Green | H02P 23/30 318/503 |
| 2014/0084830 A1* | 3/2014 | Djonga | G01K 7/427 318/400.42 |
| 2015/0211938 A1* | 7/2015 | Imakiire | G01K 7/22 702/133 |
| 2016/0301312 A1* | 10/2016 | Unru | H02J 3/381 |
| 2017/0141678 A1* | 5/2017 | Liu | H02M 7/06 |
| 2019/0131863 A1* | 5/2019 | El Markhi | H02M 3/156 |
| 2019/0181768 A1* | 6/2019 | Chennamsetty | H02M 1/08 |
| 2021/0028692 A1* | 1/2021 | Green | H02M 1/38 |
| 2021/0281204 A1* | 9/2021 | Harada | H02P 27/08 |

* cited by examiner

POWER CONVERSION DEVICE, TEMPERATURE ESTIMATION METHOD, AND NON-TRANSITORY COMPUTER READABLE STORAGE MEDIUM WITH AN EXECUTABLE PROGRAM RECORDED THEREON

CROSS-REFERENCE TO RELATED APPLICATIONS

This application claims the benefit of priority to Japanese Patent Application Number 2020-130938 filed on Jul. 31, 2020. The entire contents of the above-identified application are hereby incorporated by reference.

TECHNICAL FIELD

The present disclosure relates to a power conversion device, a temperature estimation method, and a non-transitory computer readable storage medium with an executable program recorded thereon.

BACKGROUND

In JP 2011-036095 A, a power conversion device is described that calculates a temperature difference between a reference point and a power semiconductor element on the basis of the power loss generated in the power semiconductor element and calculates the temperature of the power semiconductor element on the basis of the calculated temperature difference and the temperature at the reference point.

SUMMARY

The present disclosure provides a power conversion device, a temperature estimation method, and a non-transitory computer readable storage medium with an executable program recorded thereon which are effective in estimating the temperature of a switch of a power conversion circuit with higher accuracy.

A power conversion device according to one aspect of the present disclosure includes: a power conversion circuit including a temperature sensor configured to detect a temperature at a first position, and a switch configured to switch a connection between a primary line and a secondary line on and off at a second position separated from the first position; a loss calculation unit configured to calculate a power loss in the switch on the basis of a voltage applied between terminals of the switch, a current flowing through the switch, and on/off timing of the switch; a loss correction unit configured to correct a calculation result of the power loss on the basis of a detection result of the temperature at the first position; a temperature correction unit configured to correct the detection result of the temperature on the basis of the calculation result of the power loss; and a temperature estimation unit configured to estimate a temperature at the second position on the basis of a corrected calculation result of the power loss and a corrected detection result of the temperature.

A temperature estimation method in a power conversion circuit according to another aspect of the present disclosure, the power conversion circuit including a temperature sensor configured to detect a temperature at a first position and a switch configured to switch a connection between a primary line and a secondary line on and off at a second position separated from the first position, the temperature estimation method includes: calculating a power loss in the switch on the basis of a voltage applied between terminals of the switch, a current flowing through the switch, and on/off timing of the switch; correcting a calculation result of the power loss on the basis of a detection result of the temperature at the first position; correcting the detection result of the temperature on the basis of the calculation result of the power loss; and estimating a temperature at the second position on the basis of a corrected calculation result of the power loss and a corrected detection result of the temperature.

In a non-transitory computer readable storage medium with an executable program recorded thereon, the program according to yet another aspect of the present disclosure causes a device to execute a temperature estimation method in a power conversion circuit, the power conversion circuit including a temperature sensor configured to detect a temperature at a first position and a switch configured to switch a connection between a primary line and a secondary line on and off at a second position separated from the first position, the program including: calculating a power loss in the switch on the basis of a voltage applied between terminals of the switch, a current flowing through the switch, and on/off timing of the switch; correcting a calculation result of the power loss on the basis of a detection result of the temperature at the first position; correcting the detection result of the temperature on the basis of the calculation result of the power loss; and estimating a temperature at the second position on the basis of a corrected calculation result of the power loss and a corrected detection result of the temperature.

The present disclosure can provide a power conversion device, a temperature estimation method, and a non-transitory computer readable storage medium with an executable program recorded thereon which are effective in estimating the temperature of a switch of a power conversion circuit with higher accuracy.

DESCRIPTION OF EMBODIMENTS

Embodiments will be described in detail below with reference to the drawings. In the description, elements which are the same or have the same function are given the same reference signs, and redundant descriptions thereof are omitted.

Power Conversion Device

A power conversion device 1 according to the present embodiment is a device for supplying driving power to a motor 91 (electric motor). The motor 91 may be a synchronous electric motor or an induction electric motor. There is no particular limitation on what is driven by the motor 91, but an example is an electric vehicle such as an electric car.

Figure 1:
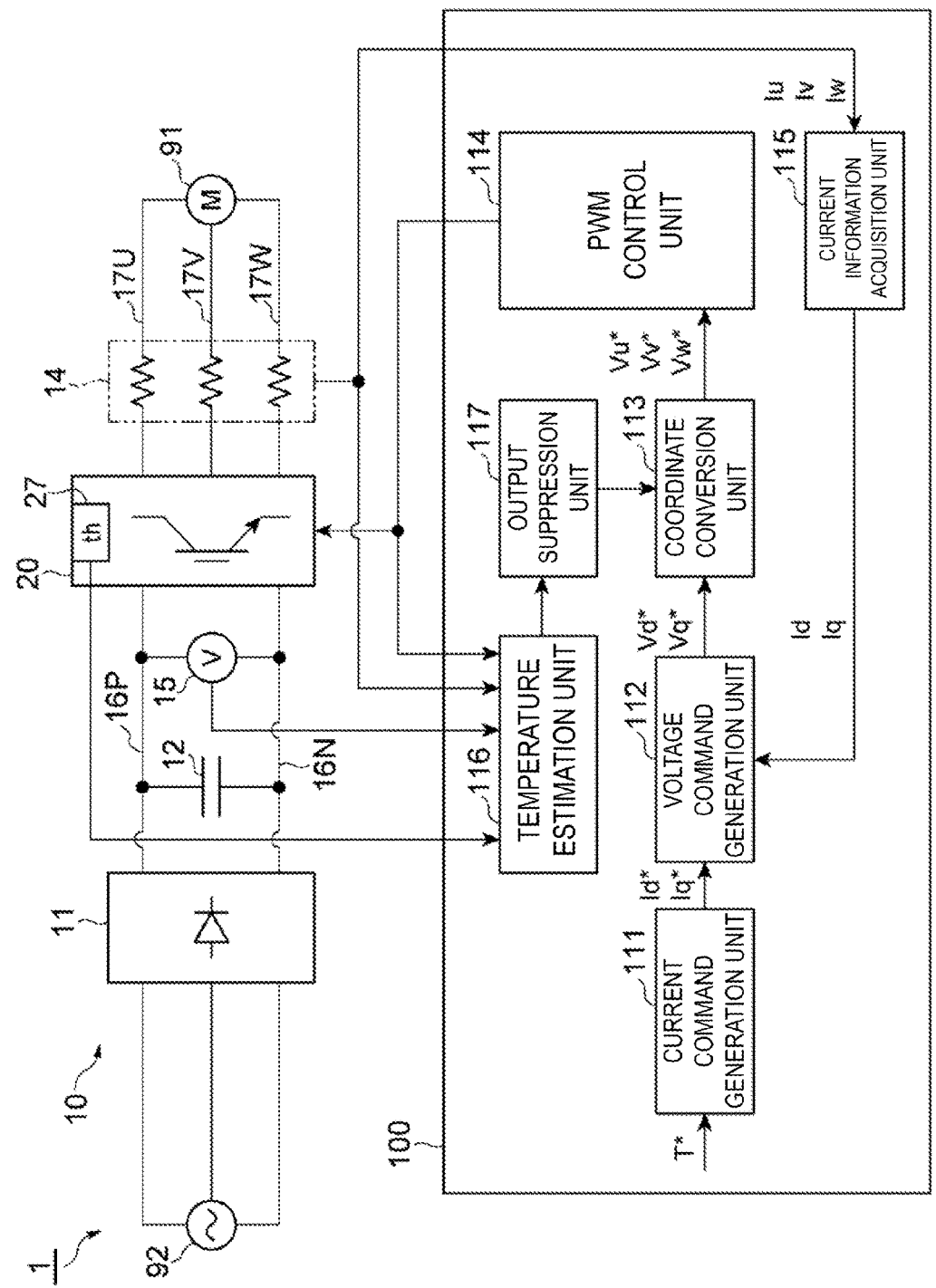
FIG. 1 is a schematic diagram illustrating an example of a configuration of a power conversion device.

As illustrated in FIG. 1, the power conversion device 1 converts power (primary power) of a power supply 92 into driving power (secondary power) and supplies the power to the motor 91. The primary power may be alternating current (AC) power or direct current (DC) power. The secondary power is AC power. As an example, the primary power and the secondary power are both three-phase AC power.

For example, the power conversion device 1 includes a power conversion circuit 10 and a control circuit 100. The power conversion circuit 10 converts the primary power into the secondary power and supplies the power to the motor 91. The power conversion circuit 10 is a voltage source inverter, for example, and applies a drive voltage in accordance with a voltage command to the motor 91. For example, the power conversion circuit 10 includes a converter circuit 11, a smoothing capacitor 12, a switching module 20, a current sensor 14, and a voltage sensor 15.

The converter circuit 11 is, for example, a diode bridge circuit or a pulse width modulation (PWM) converter circuit, and converts the primary power described above to DC power and outputs the power to a positive electrode line 16P and a negative electrode line 16N. The smoothing capacitor 12 smooths the voltage (hereinafter, referred to as DC busbar voltage) between the positive electrode line 16P and the negative electrode line 16N.

The switching module 20 performs power conversion between the DC power and the driving power and outputs the driving power to output lines 17U, 17V, 17W. For example, the switching module 20 includes a plurality of switches. Each switch switches on and off the connection between the positive electrode line 16P and the negative electrode line 16N (primary line) and the output lines 17U, 17V, 17W (secondary line).

The current sensor 14 detects the current flowing between the switching module 20 and the motor 91. For example, the current sensor 14 detects the current of each phase in the driving power. For example, the current sensor 14 detects each of the currents of the output lines 17U, 17V, 17W. The current sensor 14 may be configured to detect the currents of two lines from among the output lines 17U, 17V, 17W. Since the sum of the currents of the U, V, and W phases is zero, except in the case where a zero phase current occurs, the information of all the lines can be obtained by detecting the currents of two lines. The voltage sensor 15 detects the DC busbar voltage.

Figure 2:
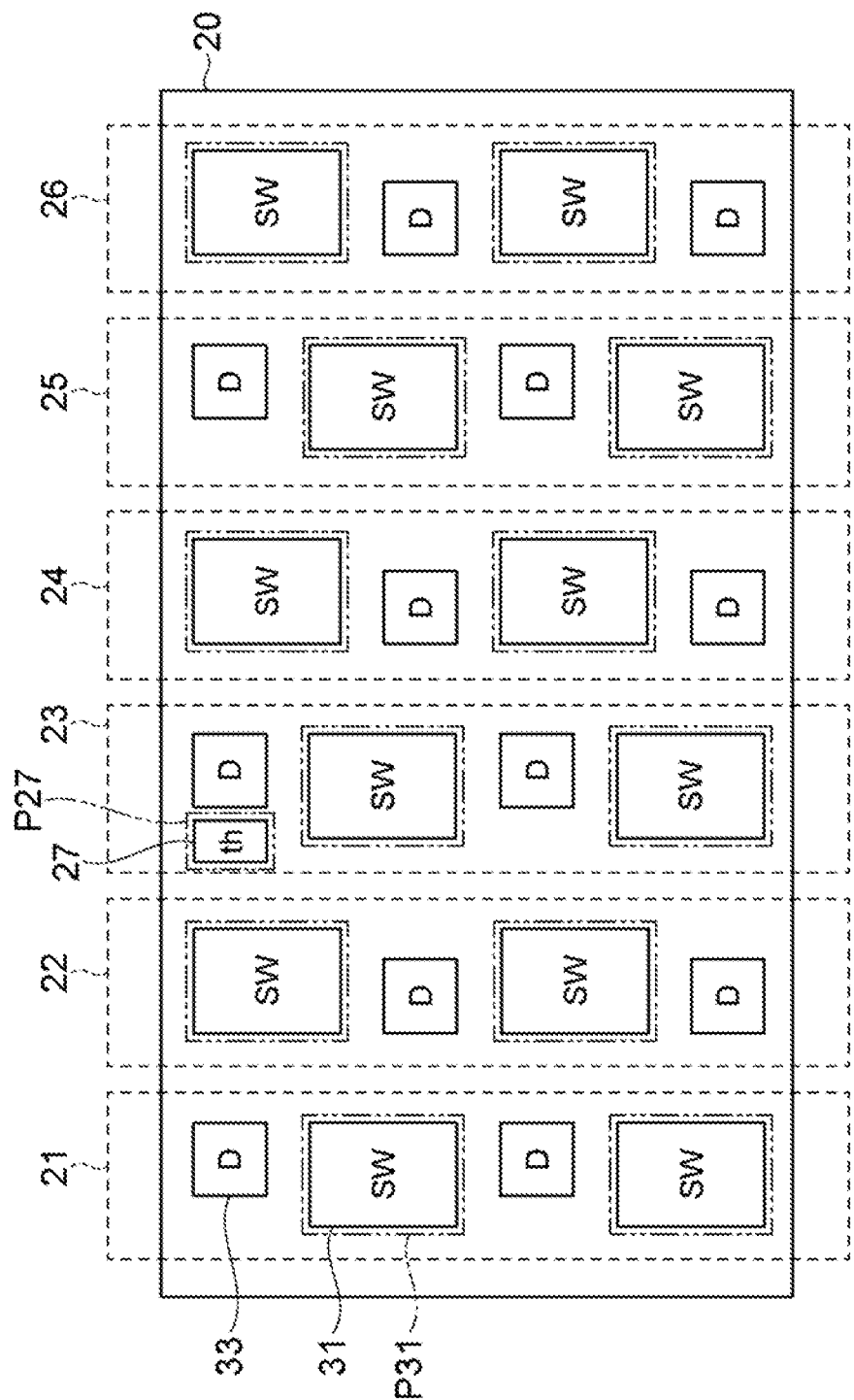
FIG. 2 is a schematic diagram illustrating an example of a general configuration of a switching module.

The switching module 20 is a module in which the plurality of switches are packaged together via a resin mold or the like. As illustrated in FIG. 2, the switching module 20 includes six sets of switching units 21, 22, 23, 24, 25, 26 and a temperature sensor 27.

Each of the switching units 21, 22, 23, 24, 25, 26 includes two switches 31 and two diodes 33. Accordingly, the switching module 20 includes twelve switches 31 and twelve diodes 33. The twelve switches 31 and the twelve diodes 33 are arranged at different positions in the switching module 20.

Each switch 31 is, for example, a power metal-oxide-semiconductor field-effect transistor (MOSFET) or an insulated gate bipolar transistor (IGBT). The two switches 31 of the switching unit 21 switch on and off the connection between the positive electrode line 16P and the output line 17U according to a gate drive signal. The two switches 31 of the switching unit 22 switch on and off the connection between the negative electrode line 16N and the output line 17U according to a gate drive signal. The two switches 31 of the switching unit 23 switch on and off the connection between the positive electrode line 16P and the output line 17V according to a gate drive signal. The two switches 31 of the switching unit 24 switch on and off the connection between the negative electrode line 16N and the output line 17V according to a gate drive signal. The two switches 31 of the switching unit 25 switch on and off the connection between the positive electrode line 16P and the output line 17W according to a gate drive signal. The two switches 31 of the switching unit 26 switch on and off the connection between the negative electrode line 16N and the output line 17W according to a gate drive signal.

The temperature sensor 27 is provided at a location (hereinafter referred to as a sensor position P27) in the switching module 20 and detects the temperature at the sensor position. The temperature sensor 27 is, for example, a thermistor. The twelve switches 31 are each provided at a position (hereinafter referred to as a switch position P31) separated from the sensor position P27 (first position). The switch position P31 (second position) is separated from the sensor position P27 by a distance at which the heat generation of the switch 31 substantially influences the detection result of the temperature sensor 27.

The configuration of the power conversion circuit 10 described above is merely an example and can be modified as appropriate as long as driving power can be supplied to the motor 91. For example, the power conversion circuit 10 may be a current source inverter. A current source inverter outputs a drive current to the motor 91 in accordance with a current command. The power conversion circuit 10 may be a matrix converter circuit that performs bidirectional power conversion between a power of a power supply and a driving power without DC conversion. In a case where the power of the power supply is DC power, the power conversion circuit 10 need not include the converter circuit 11. Each of the switching units 21, 22, 23, 24, 25, 26 need not include the two switches 31 and at least the two diodes 33 and need only include at least one switch 31 and at least one diode 33. The switching module 20 may also include two or more of the temperature sensors 27.

Returning to FIG. 1, the control circuit 100 controls the power conversion circuit 10 such that driving power is supplied to the motor 91. For example, in a case where the power conversion circuit 10 is a voltage source inverter, the control circuit 100 generates a current command on the basis of a drive power command, generates a voltage command on the basis of the current command, and controls the power conversion circuit 10 such that a drive voltage is applied to the motor 91 in accordance with the voltage command. In a case where the power conversion circuit 10 is a current source inverter, the control circuit 100 generates a current command on the basis of a drive power command and controls the power conversion circuit 10 such that a drive current is supplied to the motor 91 in accordance with the current command.

Here, in the power conversion circuit 10 that performs power conversion by switching the switches 31 on and off as described above, heat generated by the switches 31 causes an increase in the temperature of the switching module 20. In a case where the temperature of the switching module 20 increases to near a tolerance level, it becomes necessary to suppress the output current (the current output to the output lines 17U, 17V, 17W) of the switching module 20 such that the temperature of the switches 31 does not exceed the tolerance level.

In such output suppression, a temperature detection value obtained by the temperature sensor 27 can be used. However, since the position (the switch position P31) of the switches 31 which are the heat source is separated from the position (the sensor position P27) of the temperature sensor 27, the actual temperature of each of the switches 31 may be higher than the detection result obtained by the temperature sensor 27.

The difference between the temperature at the switches 31 and the temperature detection value obtained by the temperature sensor 27 can be estimated on the basis of the power loss in the switches 31. Thus, by estimating the temperature of each switch 31, it is possible to more reliably reduce the temperature of the switches 31 to the tolerance level or below. However, in estimating the temperature of the switches 31 on the basis of the temperature detection result and the power loss calculation result, both a temperature detection error and a power loss calculation error may occur.

Regarding this, the control circuit 100 is configured to execute the following: calculating the power loss in the switches 31 on the basis of the voltage applied between the terminals of the switches 31, the current flowing through the switches 31, and the on/off timing of the switches 31; correcting the power loss calculation result on the basis of the detection result of the temperature at the sensor position P27 obtained by the temperature sensor 27; correcting the detection result of the temperature obtained by the temperature sensor 27 on the basis of the power loss calculation result; and estimating the temperature at the switch positions P31 on the basis of the corrected power loss calculation result and the corrected temperature detection result.

Since the temperature at the sensor position P27 and the power loss in the switches 31 are correlated, by using the power loss calculation result, the detection result of the temperature at the sensor position P27 can be appropriately corrected, and by using the detection result of the temperature at the sensor position P27, the power loss calculation result can be appropriately corrected. Accordingly, such correction is effective in estimating the temperature of the switches 31 of the power conversion circuit 10 with higher accuracy. An example of a configuration of the control circuit 100 in a case where the power conversion circuit 10 is a voltage source inverter will be described in detail below.

Overall Configuration of Control Circuit

As illustrated in FIG. 1, the control circuit 100 includes, as functional configurations (hereinafter referred to as functional blocks), a current command generation unit 111, a voltage command generation unit 112, a coordinate conversion unit 113, a PWM control unit 114, a current information acquisition unit 115, a temperature estimation unit 116, and an output suppression unit 117.

The current command generation unit 111 generates a current command on the basis of a torque command T*. The torque command T* is generated by the control circuit 100 to cause the speed of the motor 91 to conform to the target speed. The current command generation unit 111 may acquire the torque command T* from a higher level controller of the power conversion device 1. For example, the current command generation unit 111 generates a d-axis current command Id* and a q-axis current command Iq*.

The d-axis and the q-axis are the coordinate axes of a dq coordinate system. The dq coordinate system is a coordinate system that rotates together with the rotor of the motor 91. The d-axis is the coordinate axis along the magnetic pole direction of the rotor of the motor 91, and the q-axis is the coordinate axis perpendicular to the d-axis. The angle of rotation of the dq coordinate system is represented by an electrical angle relative to an $\alpha\beta$ coordinate system fixed to a stator of the motor 91. The $\alpha\beta$ coordinate system has an $\alpha$-axis and a $\beta$-axis perpendicular to one another.

The voltage command generation unit 112 generates a voltage command on the basis of the current command. For example, the voltage command generation unit 112 generates a d-axis voltage command Vd* and a q-axis voltage command Vq* on the basis of the d-axis current command Id* and the q-axis current command Iq* For example, the voltage command generation unit 112 calculates the d-axis voltage command Vd* and the q-axis voltage command Vq* on the basis of the d-axis current command Id*, the q-axis current command Iq*, a d-axis current Id, and a q-axis current Iq so as to reduce the deviation between the d-axis current command Id* and the d-axis current Id and reduce the deviation between the q-axis current command Iq* and the q-axis current Iq. As described below, the d-axis current Id and the q-axis current Iq are obtained using the detection value obtained from the current sensor 14.

The coordinate conversion unit 113, for the d-axis voltage command Vd* and the q-axis voltage command Vq*, performs a coordinate conversion from the dq coordinate system to the $\alpha\beta$ coordinate system and a conversion from two phase to three phase and calculates a U phase voltage command Vu*, a V phase voltage command Vv*, and a W phase voltage command Vw*. The PWM control unit 114 switches the plurality of switches 31 of the switching module 20 on and off such that drive voltages in accordance with the U phase voltage command Vu*, the V phase voltage command Vv*, and the W phase voltage command Vw* are applied to the output lines 17U, 17V, 17W.

The current information acquisition unit 115 acquires a detection value obtained by the current sensor 14. This detection value includes, for example, a U phase current Iu, a V phase current Iv, and a W phase current Iw. The current information acquisition unit 115, for the U phase current Iu, the V phase current Iv, and the W phase current Iw, performs a conversion from three phase to two phase and a coordinate conversion from the $\alpha\beta$ coordinate system to the dq coordinate system and calculates the d-axis current Id and the q-axis current Iq described above.

The temperature estimation unit 116 estimates the temperature at the switch positions P31 on the basis of a detection result of the temperature at the sensor position P27 obtained by the temperature sensor 27 and the power loss calculation result described above. The configuration of the control circuit 100 for estimating the temperature at the switch positions P31 will be described in detail separately. In a case where the estimation result of the switch position P31 obtained by the temperature estimation unit 116 exceeds a predetermined level, the output suppression unit 117 causes the driving power to be reduced via the PWM control unit 114 until the estimation result of the switch position P31 falls below the predetermined level.

Configuration for Estimating Temperature

Figure 3:
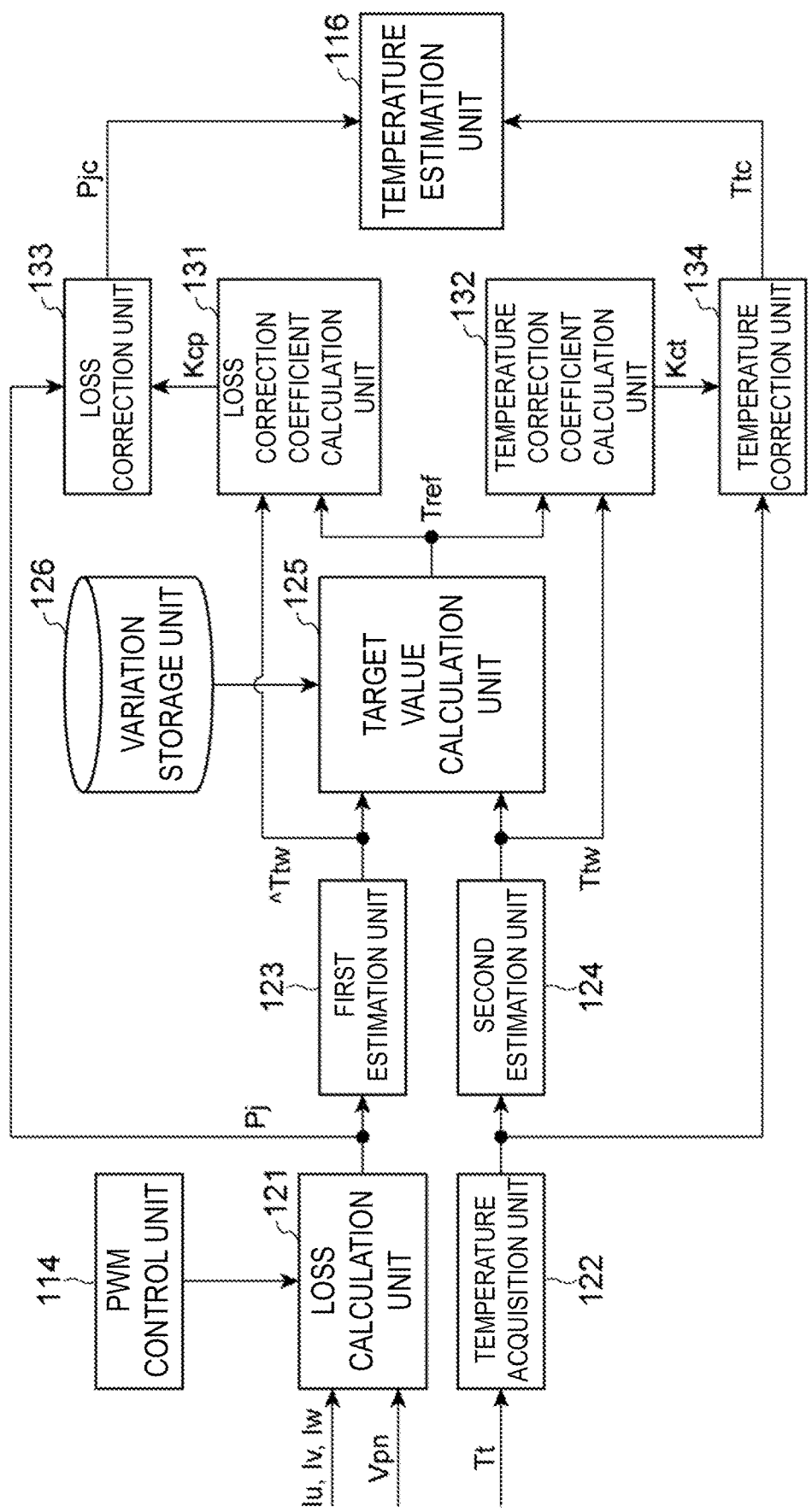
FIG. 3 is a block diagram illustrating an example of a configuration for estimating the temperature.

An example of the configuration for estimating the temperature at the switch positions P31 is described in detail below. As illustrated in FIG. 3, the control circuit 100 further includes a loss calculation unit 121, a temperature acquisition unit 122, a first estimation unit 123, a second estimation unit 124, a loss correction unit 133, and a temperature correction unit 134.

The loss calculation unit 121 calculates the power loss in the switches 31 on the basis of the voltage applied between the terminals of the switches 31, the current flowing through the switches 31, and the on/off timing of the switches 31. Hereinafter, the calculation result of the power loss obtained by the loss calculation unit 121 is referred to as a loss calculation value Pj.

The loss calculation unit 121 may calculate the loss on the basis of a DC busbar voltage Vpn (voltage of the primary line) detected by the voltage sensor 15, the U phase current Iu, the V phase current Iv, and the W phase current Iw (currents of the secondary line) detected by the current sensor 14, and the on/off timing of the switches 31. In this case, the loss calculation unit 121 converts the DC busbar voltage Vpn detected by the voltage sensor 15 and the U phase current Iu, the V phase current Iv, and the W phase current Iw detected by the current sensor 14 into a voltage applied between the terminals of the switches 31 and a current flowing through the switches 31.

The loss calculation unit 121 acquires information relating to the on/off timing of the switches 31 from the PWM control unit 114. For example, the loss calculation unit 121 acquires, as the information relating to the on/off timing of the switches 31, the ratio of the on period of the switches 31 relative to the carrier period from the PWM control unit 114. As the detection result of the temperature at the sensor position P27, the temperature acquisition unit 122 acquires a temperature detection value Tt via the temperature sensor 27.

The first estimation unit 123 calculates a first estimation value for a predetermined estimation target on the basis of the calculation result (the loss calculation value Pj) of the power loss obtained by the loss calculation unit 121. The estimation target is, for example, the temperature difference between the temperature at the sensor position P27 and the ambient environment temperature. The ambient environment temperature is the temperature of the environment in which the switching module 20 is disposed. A specific example of ambient environment temperature includes the temperature of the coolant for cooling the motor 91 and the power conversion circuit 10. For example, the first estimation unit 123 calculates a first estimation value ^Ttw of the temperature difference between the temperature at the sensor position P27 and the ambient environment temperature on the basis of the thermal resistance between each switch position P31 and the sensor position P27 and the loss calculation value Pj of each switch 31.

The second estimation unit 124 calculates a second estimation value for the estimation target described above on the basis of the temperature detection value Tt. For example, the second estimation unit 124 calculates a second estimation value Ttw of the temperature difference between the temperature at the sensor position P27 and the ambient environment temperature on the basis of the temperature detection value Tt and the ambient environment temperature. The second estimation unit 124 may use the detection value of the ambient environment temperature in the calculation of the second estimation value Ttw, or may use the estimation value of the ambient environment temperature in the calculation of the second estimation value Ttw. For example, the second estimation unit 124 acquires an ambient environment temperature ^Tw estimated by an environment temperature estimation unit 148 described below and calculates the second estimation value Ttw on the basis of the temperature detection value Tt and the ambient environment temperature ^Tw.

The loss correction unit 133 corrects the loss calculation value Pj on the basis of the temperature detection value Tt. For example, the loss correction unit 133 corrects the loss calculation value Pj so as to bring the first estimation value ^Ttw obtained by the first estimation unit 123 closer to the second estimation value Ttw obtained by the second estimation unit 124. The temperature correction unit 134 corrects the temperature detection value Tt on the basis of the loss calculation value Pj. For example, the temperature correction unit 134 corrects the temperature detection value Tt so as to bring the second estimation value Ttw obtained by the second estimation unit 124 closer to the first estimation value ^Ttw obtained by the first estimation unit 123.

Accordingly, the loss correction unit 133 corrects the loss calculation value Pj so as to bring the first estimation value ^Ttw closer to the second estimation value Ttw, and the temperature correction unit 134 corrects the temperature detection value Tt so as to bring the second estimation value Ttw closer to the first estimation value ^Ttw. In this manner, the first estimation value ^Ttw and the second estimation value Ttw converge on the same value. The first estimation value ^Ttw and the second estimation value Ttw converging on the same value in relation to the same estimation target allows the loss calculation value Pj and the temperature detection value Tt to be appropriately corrected.

The temperature estimation unit 116 estimates the temperature at the switch positions P31 on the basis of the loss calculation value Pj corrected by the loss correction unit 133 and the temperature detection value Tt corrected by the temperature correction unit 134. For example, the temperature estimation unit 116 calculates the temperature difference (hereinafter referred to as a module internal temperature difference) between the temperature at each of the switch positions P31 and the temperature at the sensor position P27 on the basis of the thermal resistance between the switch positions P31 and the sensor position P27 and the loss calculation value Pj corrected by the loss correction unit 133. The temperature estimation unit 116 estimates the temperature at each switch position P31 on the basis of the module internal temperature difference and the temperature detection value Tt corrected by the temperature correction unit 134.

The control circuit 100 may be configured to adjust the ratio of the correction amount of the first estimation value ^Ttw and the correction amount of the second estimation value Ttw on the basis of the magnitude of variation in the first estimation value ^Ttw and the magnitude of variation in the second estimation value Ttw. For example, the control circuit 100 may be configured to reduce the correction amount of the first estimation value ^Ttw and to increase the correction amount of the second estimation value Ttw in response to the ratio of the magnitude of variation in the second estimation value Ttw to the magnitude of variation in the first estimation value ^Ttw increasing. By greatly correcting the one of the first estimation value ^Ttw and the second estimation value Ttw that has variation of a greater magnitude (less reliability), the loss calculation value Pj and the temperature detection value Tt are more appropriately corrected.

The control circuit 100 further includes a variation storage unit 126, for example. The variation storage unit 126 stores a first variation evaluation value that represents variation in the first estimation value ^Ttw under a predetermined condition and a second variation evaluation value that represents variation in the second estimation value Ttw under a predetermined condition. Specific examples of the predetermined condition include the ambient environment temperature being maintained at a predetermined value, the DC busbar voltage Vpn being maintained at a predetermined value, and the amplitude and frequency of the U phase current Iu, the V phase current Iv, and the W phase current Iw being maintained at predetermined values. A specific example of the first variation evaluation value includes a standard deviation of the first estimation value ^Ttw under the predetermined condition described above. A specific example of the second variation evaluation value includes a standard deviation of the second estimation value Ttw under the predetermined condition described above. The first variation evaluation value and the second variation evaluation value are calculated in advance on the basis of data obtained by actual device testing.

The loss correction unit 133 corrects the loss calculation value Pj so as to reduce the component corresponding to the first variation evaluation value of the difference between the first estimation value ^Ttw and the second estimation value Ttw. The temperature correction unit 134 corrects the temperature detection value Tt so as to reduce the component corresponding to the second variation evaluation value of the difference between the first estimation value ^Ttw and the second estimation value Ttw. For example, the control circuit 100 further includes a target value calculation unit 125, a loss correction coefficient calculation unit 131, and a temperature correction coefficient calculation unit 132.

The target value calculation unit 125 calculates a temperature target value Tref on the basis of the first estimation value ^Ttw, the second estimation value Ttw, the first variation evaluation value, and the second variation evaluation value. The temperature target value Tref is a common convergence target value for the first estimation value ^Ttw and the second estimation value Ttw. The target value calculation unit 125 calculates the temperature target value Tref according to the following equation.

$$Tref = \hat{T}tw \cdot K2/(K1+K2) + Ttw \cdot K1/(K1+K2) \quad (1)$$

K1: First variation evaluation value
K2: Second variation evaluation value

The loss correction coefficient calculation unit 131 calculates a loss correction coefficient Kcp to cause the first estimation value ^Ttw to converge with the temperature target value Tref. The loss correction coefficient Kcp is a correction coefficient for the loss calculation value Pj. The loss correction unit 133 corrects the loss calculation value Pj by multiplying the loss calculation value Pj by the loss correction coefficient Kcp. The first estimation value ^Ttw based on the corrected loss calculation value Pj converges with the temperature target value Tref.

The temperature correction coefficient calculation unit 132 calculates a temperature correction coefficient Kct to cause the second estimation value Ttw to converge with the temperature target value Tref. The temperature correction coefficient Kct is a correction coefficient for the temperature detection result. The temperature correction unit 134 corrects the temperature detection value Tt by multiplying the temperature detection value Tt by the temperature correction coefficient Kct. The second estimation value Ttw based on the corrected temperature detection value Tt converges with the temperature target value Tref.

Figure 4:
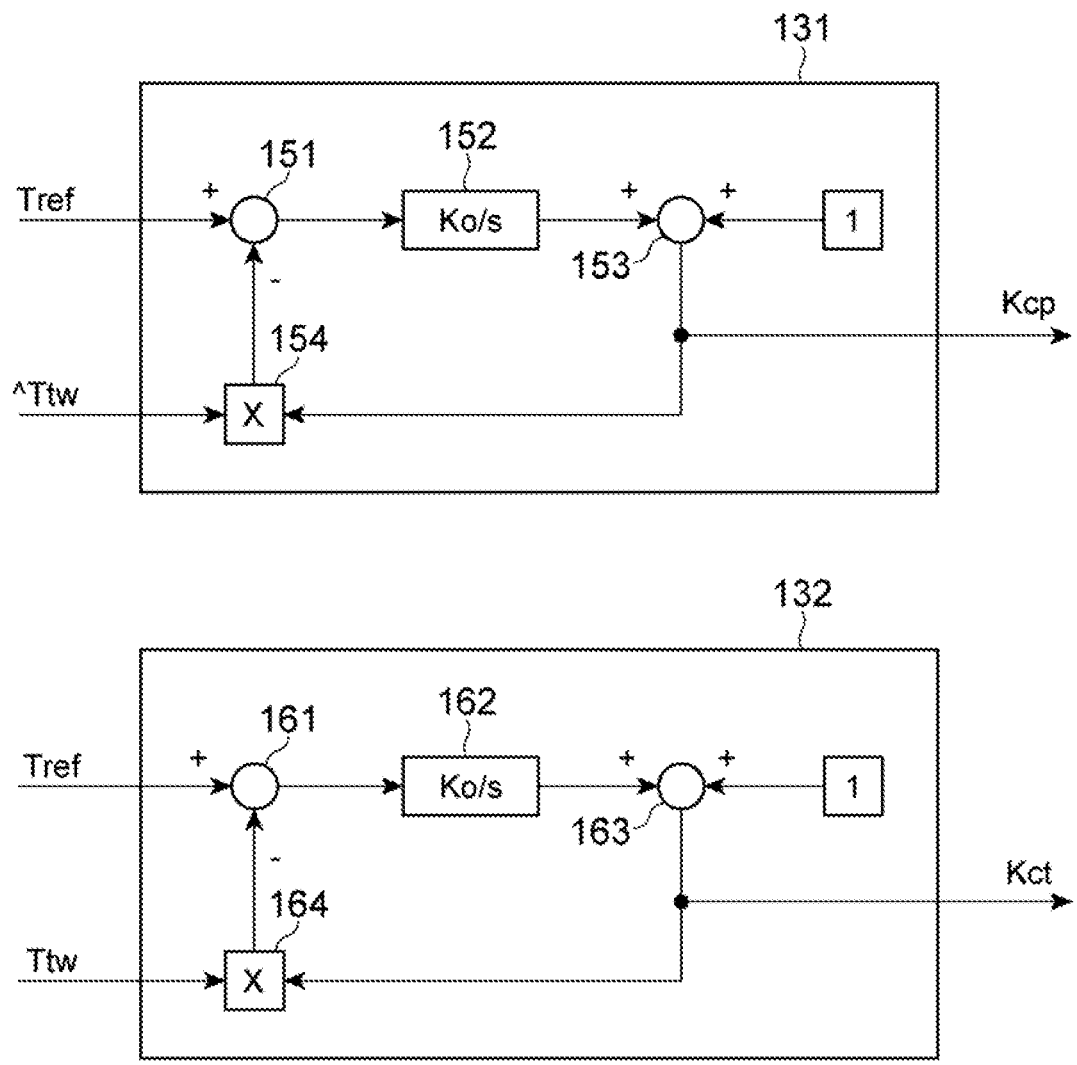
FIG. 4 is a block diagram illustrating an example of processing executed by a loss correction coefficient calculation unit and a temperature correction coefficient calculation unit.

FIG. 4 is a block diagram illustrating an example of processing executed by the loss correction coefficient calculation unit 131 and the temperature correction coefficient calculation unit 132. The loss correction coefficient calculation unit 131 calculates the deviation between the temperature target value Tref and the first estimation value ^Ttw at an addition point 151, calculates the correction factor by multiplying the deviation by a transfer function 152 representing the proportional/integral, adds together the correction factor and 1 at an addition point 153, and calculates the loss correction coefficient Kcp. Furthermore, the loss correction coefficient calculation unit 131 multiplies the loss correction coefficient Kcp by the first estimation value ^Ttw at a multiplication point 154 and corrects the first estimation value ^Ttw. The loss correction coefficient calculation unit 131 calculates the loss correction coefficient Kcp that causes the first estimation value ^Ttw to converge with the temperature target value Tref by repeating the processing described above until the deviation calculated at the addition point 151 falls below a predetermined threshold.

The temperature correction coefficient calculation unit 132 calculates the deviation between the temperature target value Tref and the second estimation value Ttw at an addition point 161, calculates the correction factor by multiplying the deviation by a transfer function 162 representing the proportional/integral, adds together the correction factor and 1 at an addition point 163, and calculates the temperature correction coefficient Kct. Furthermore, the temperature correction coefficient calculation unit 132 multiplies the temperature correction coefficient Kct by the second estimation value Ttw at a multiplication point 164 and corrects the second estimation value Ttw. The temperature correction coefficient calculation unit 132 calculates the temperature correction coefficient Kct that causes the second estimation value Ttw to converge with the temperature target value Tref by repeating the processing described above until the deviation calculated at the addition point 161 falls below a predetermined threshold.

Figure 5:
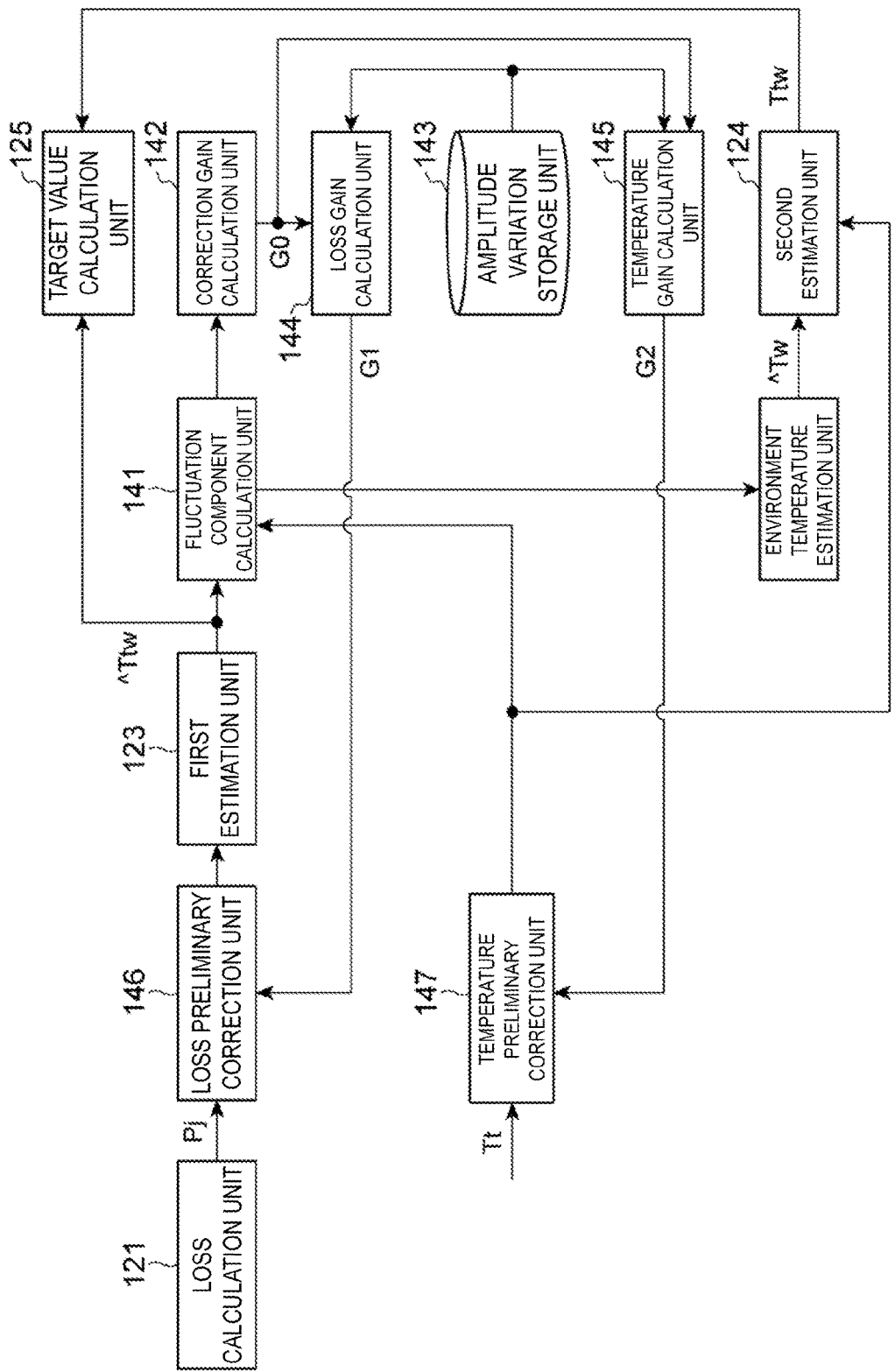
FIG. 5 is a block diagram illustrating a modified example of a configuration for estimating the temperature.

The control circuit 100 may be configured to further execute, before correction of the loss calculation value Pj by the loss correction unit 133 and correction of the temperature detection value Tt by the temperature correction unit 134, correction of the loss calculation value Pj so as to bring the fluctuation component of the first estimation value ^Ttw closer to the fluctuation component of the second estimation value Ttw and correction of the temperature detection value Tt so as to bring the fluctuation component of the second estimation value Ttw closer to the fluctuation component of the first estimation value ^Ttw. For example, as illustrated in FIG. 5, the control circuit 100 further includes a loss preliminary correction unit 146 and a temperature preliminary correction unit 147.

The loss preliminary correction unit 146 corrects the loss calculation value Pj so as to bring the fluctuation component of the first estimation value ^Ttw closer to the fluctuation component of the temperature detection value Tt. The temperature preliminary correction unit 147 corrects the temperature detection value Tt so as to bring the fluctuation component of the temperature detection value Tt closer to the fluctuation component of the first estimation value ^Ttw.

Accordingly, the loss preliminary correction unit 146 corrects the loss calculation value Pj so as to bring the fluctuation component of the first estimation value ^Ttw closer to the fluctuation component of the second estimation value Ttw, and the temperature preliminary correction unit 147 corrects the temperature detection value Tt so as to bring the fluctuation component of the second estimation value Ttw closer to the fluctuation component of the first estimation value ^Ttw. In this manner, the fluctuation component of the first estimation value ^Ttw and the fluctuation component of the second estimation value Ttw converge on the same value. The fluctuation component of the first estimation value ^Ttw and the fluctuation component of the second estimation value Ttw converging on the same value in relation to the same estimation target allows the loss calculation value Pj and the temperature detection value Tt to be appropriately corrected.

The first estimation unit 123 calculates the first estimation value ^Ttw on the basis of the loss calculation value Pj corrected by the loss preliminary correction unit 146. Hereinafter, this first estimation value ^Ttw is referred to as the post gain correction first estimation value ^Ttw. The second estimation unit 124 calculates the second estimation value Ttw on the basis of the temperature detection value Tt corrected by the temperature preliminary correction unit 147. Hereinafter, this second estimation value Ttw is referred to as the post gain correction second estimation value Ttw. The target value calculation unit 125 calculates the temperature target value Tref on the basis of the post gain correction first estimation value ^Ttw and the post gain correction second estimation value Ttw.

The control circuit 100 may be configured to adjust the ratio of the correction amount of the fluctuation component of the first estimation value ^Ttw and the correction amount of the fluctuation component of the second estimation value Ttw on the basis of the magnitude of variation in the fluctuation component of the first estimation value ^Ttw and the magnitude of variation in the fluctuation component of the second estimation value Ttw. For example, the control circuit 100 may be configured to reduce the correction amount of the fluctuation component of the first estimation value ^Ttw and to increase the correction amount of the fluctuation component of the second estimation value Ttw in response to the ratio of the magnitude of variation in the fluctuation component of the second estimation value Ttw to the magnitude of variation in the fluctuation component of the first estimation value ^Ttw increasing. By greatly correcting the one of the fluctuation component of the first estimation value ^Ttw and the fluctuation component of the second estimation value Ttw that has variation of a greater magnitude (less reliability), the loss calculation value Pj and the temperature detection value Tt are more appropriately corrected.

For example, the control circuit 100 further includes a fluctuation component calculation unit 141 and an amplitude variation storage unit 143. The fluctuation component calculation unit 141 calculates the difference between the fluctuation component of the first estimation value ^Ttw and the fluctuation component of the second estimation value Ttw. In a case where the ambient environment temperature is a constant value, the fluctuation component of the second estimation value Ttw is equivalent to the fluctuation component of the temperature detection value Tt. In this case, the fluctuation component calculation unit 141 may calculate the difference between the fluctuation component of the first estimation value ^Ttw and the fluctuation component of the temperature detection value Tt as the difference between the fluctuation component of the first estimation value ^Ttw and the fluctuation component of the second estimation value Ttw. For example, the fluctuation component calculation unit 141 calculates the fluctuation component of the difference between the first estimation value ^Ttw and the temperature detection value Tt as the difference between the fluctuation component of the first estimation value ^Ttw and the fluctuation component of the temperature detection value Tt. An example of calculation processing of the fluctuation component of the difference executed by the fluctuation component calculation unit 141 will be described separately.

The amplitude variation storage unit 143 stores a first amplitude variation evaluation value that represents variation in the amplitude of the first estimation value ^Ttw under a predetermined condition and a second amplitude variation evaluation value that represents variation in the amplitude of the second estimation value Ttw under a predetermined condition. Specific examples of the predetermined condition include the ambient environment temperature being maintained at a predetermined value, the DC busbar voltage Vpn being maintained at a predetermined value, and the amplitude and frequency of the U phase current Iu, the V phase current Iv, and the W phase current Iw being maintained at predetermined values. A specific example of the first amplitude variation evaluation value includes a standard deviation of the amplitude of the first estimation value ^Ttw under the predetermined condition described above. A specific example of the second amplitude variation evaluation value includes a standard deviation of the amplitude of the second estimation value Ttw under the predetermined condition described above. The first amplitude variation evaluation value and the second amplitude variation evaluation value are calculated in advance on the basis of data obtained by actual device testing.

The loss preliminary correction unit 146 corrects the loss calculation value Pj so as to reduce the component corresponding to the first amplitude variation evaluation value of the fluctuation component of the difference calculated by the fluctuation component calculation unit 141. The temperature preliminary correction unit 147 corrects the temperature detection value Tt so as to reduce the component corresponding to the second amplitude variation evaluation value of the fluctuation component of the difference calculated by the fluctuation component calculation unit 141. For example, the control circuit 100 further includes a correction gain calculation unit 142, a loss gain calculation unit 144, and a temperature gain calculation unit 145.

The correction gain calculation unit 142 calculates a correction gain G0 for reducing the fluctuation component of the difference on the basis of the fluctuation component of the difference. The correction gain calculation unit 142 calculates the correction gain G0 to be a positive value in a case where the fluctuation component of the first estimation value ^Ttw is greater than the fluctuation component of the second estimation value Ttw and to be a negative value in a case where the fluctuation component of the first estimation value ^Ttw is less than the fluctuation component of the second estimation value Ttw. An example of calculation processing of the correction gain G0 by the correction gain calculation unit 142 will be described separately.

The loss gain calculation unit 144 calculates a loss gain G1 for correcting the loss calculation value Pj on the basis of the first amplitude variation evaluation value, the second amplitude variation evaluation value, and the correction gain G0. For example, the loss gain calculation unit 144 calculates the loss gain G1 according to the following equation.

$$G1 = 1 - (K11^2/(K11^2 + K12^2)^{1/2}) \cdot G0 \quad (2)$$

K11: First amplitude variation evaluation value
K12: Second amplitude variation evaluation value The temperature gain calculation unit 145 calculates a temperature gain G2 for correcting the temperature detection value Tt on the basis of the first amplitude variation evaluation value, the second amplitude variation evaluation value, and the correction gain G0. For example, the temperature gain calculation unit 145 calculates the temperature gain G2 according to the following equation.

$$G2=1+(K12^2/(K11^2+K12^2)^{1/2})\cdot G0 \quad (3)$$

The loss preliminary correction unit 146 corrects the loss calculation value Pj by multiplying the loss calculation value Pj by the loss gain G1 The temperature gain calculation unit 145 corrects the temperature detection value Tt by multiplying the temperature detection value Tt by the temperature gain G2.

As described above, the correction gain G0 is a positive value in a case where the fluctuation component of the first estimation value ^Ttw is greater than the fluctuation component of the second estimation value Ttw and is a negative value in a case where the fluctuation component of the first estimation value ^Ttw is less than the fluctuation component of the second estimation value Ttw. Thus, in a case where the fluctuation component of the first estimation value ^Ttw is greater than the fluctuation component of the second estimation value Ttw, the loss gain G1 is a value less than 1, and the temperature gain G2 is a value greater than 1. The fluctuation component of the first estimation value ^Ttw is decreased toward the fluctuation component of the second estimation value Ttw by multiplying the loss calculation value Pj by the loss gain G1. The fluctuation component of the second estimation value Ttw is increased toward the fluctuation component of the first estimation value ^Ttw by multiplying the temperature detection value Tt by the temperature gain G2. In this manner, the fluctuation component of the difference described above is reduced.

In a case where the fluctuation component of the first estimation value ^Ttw is less than the fluctuation component of the second estimation value Ttw, the loss gain G1 is a value greater than 1, and the temperature gain G2 is a value less than 1. The fluctuation component of the first estimation value ^Ttw is increased toward the fluctuation component of the second estimation value Ttw by multiplying the loss calculation value Pj by the loss gain G1. The fluctuation component of the second estimation value Ttw is decreased toward the fluctuation component of the first estimation value ^Ttw by multiplying the temperature detection value Tt by the temperature gain G2. In this manner, the fluctuation component of the difference described above is reduced.

The ratio of decreasing or increasing the fluctuation component of the first estimation value ^Ttw by multiplying the loss calculation value Pj by the loss gain G1 is determined in accordance with the magnitude of a first amplitude variation evaluation value K11. The ratio of increasing or decreasing the fluctuation component of the second estimation value Ttw by multiplying the temperature detection value Tt by the temperature gain G2 is determined in accordance with the magnitude of a second amplitude variation evaluation value K12. Thus, via multiplying the loss calculation value Pj by the loss gain G1, the loss preliminary correction unit 146 corrects the loss calculation value Pj so as to reduce the component corresponding to the first amplitude variation evaluation value K11 of the fluctuation component of the difference. Also, via multiplying the temperature detection value Tt by the temperature gain G2, the temperature preliminary correction unit 147 corrects the temperature detection value Tt so as to reduce the component corresponding to the second amplitude variation evaluation value K12 of the fluctuation component of the difference.

The control circuit 100 may be configured so that, after correcting the loss calculation value Pj via the loss preliminary correction unit 146 and correcting the temperature detection value Tt via the temperature preliminary correction unit 147, the control circuit 100 repeats calculation of the fluctuation component of the difference by the fluctuation component calculation unit 141 and correction of the loss calculation value Pj by the loss preliminary correction unit 146 and correction of the temperature detection value Tt by the temperature preliminary correction unit 147 until the fluctuation component of the difference falls below a predetermined threshold. In this case, the first estimation value ^Ttw calculated by the first estimation unit 123 on the basis of the loss calculation value Pj after the fluctuation component of the difference falls below the threshold value corresponds to the post gain correction first estimation value ^Ttw. Also, the second estimation value Ttw calculated by the second estimation unit 124 on the basis of the temperature detection value Tt after the fluctuation component of the difference falls below the threshold value corresponds to the post gain correction second estimation value Ttw.

The control circuit 100 may further include the environment temperature estimation unit 148. The environment temperature estimation unit 148 estimates the ambient environment temperature on the basis of the loss calculation value Pj corrected by the loss preliminary correction unit 146 and the temperature detection value Tt corrected by the temperature preliminary correction unit 147. For example, the environment temperature estimation unit 148 estimates the ambient environment temperature ^Tw on the basis of the difference between the post gain correction first estimation value ^Ttw and the temperature detection value Tt. The second estimation unit 124 calculates the post gain correction second estimation value Ttw on the basis of the temperature detection value Tt corrected by the temperature preliminary correction unit 147 and the ambient environment temperature ^Tw estimated by the environment temperature estimation unit 148.

Figure 6:
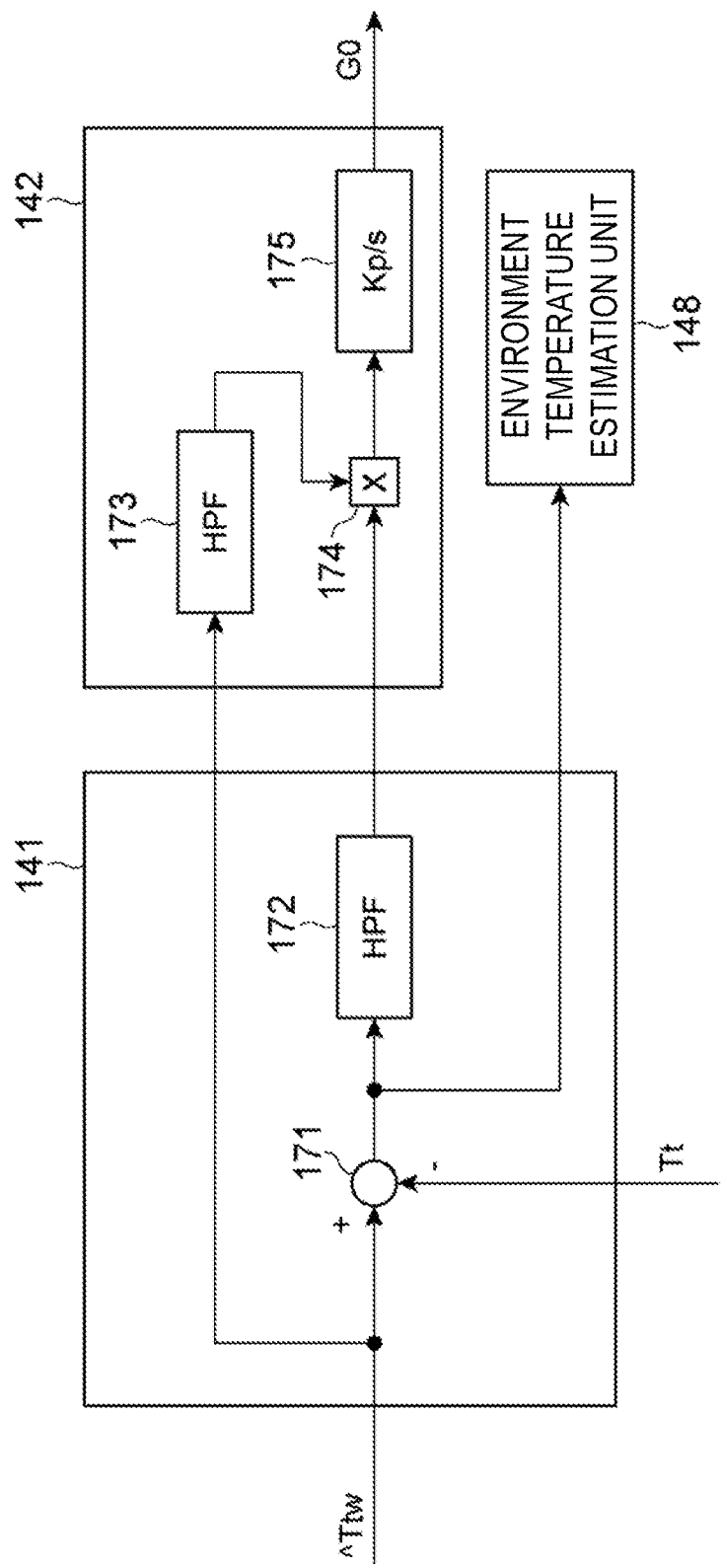
FIG. 6 is a block diagram illustrating an example of processing executed by a fluctuation component calculation unit.

FIG. 6 is a block diagram illustrating the calculation processing of the fluctuation component of the difference executed by the fluctuation component calculation unit 141 and the calculation processing of the correction gain G0 executed by the correction gain calculation unit 142. The fluctuation component calculation unit 141 calculates the deviation between the first estimation value ^Ttw and the temperature detection value Tt at an addition point 171 and multiples the deviation by a transfer function 172 representing high-pass type filtering to calculate the fluctuation component of the difference described above.

The correction gain calculation unit 142 multiplies a transfer function 173 representing the high-pass type filtering by the first estimation value ^Ttw to calculate the fluctuation component of the first estimation value ^Ttw and multiplies the fluctuation component of the difference by the first estimation value ^Ttw at a multiplication point 174. In this manner, a provisional correction gain is calculated to be a positive value in a case where the first estimation value ^Ttw is greater than the second estimation value Ttw and to be a negative value in a case where the first estimation value ^Ttw is less than the second estimation value Ttw. The correction gain calculation unit 142 calculates the correction gain G0 by multiplying the provisional correction gain by a transfer function 175 representing the proportional/integral. The environment temperature estimation unit 148 calculates the ambient environment temperature ^Tw described above on the basis of the deviation calculated by the fluctuation component calculation unit 141 at the addition point 171.

With the example of the functional configuration of the control circuit 100 described above, since each of the functional blocks is a component of the control circuit 100, processing content being executed by each of the functional blocks is equivalent to processing content being executed by the control circuit 100.

Figure 7:
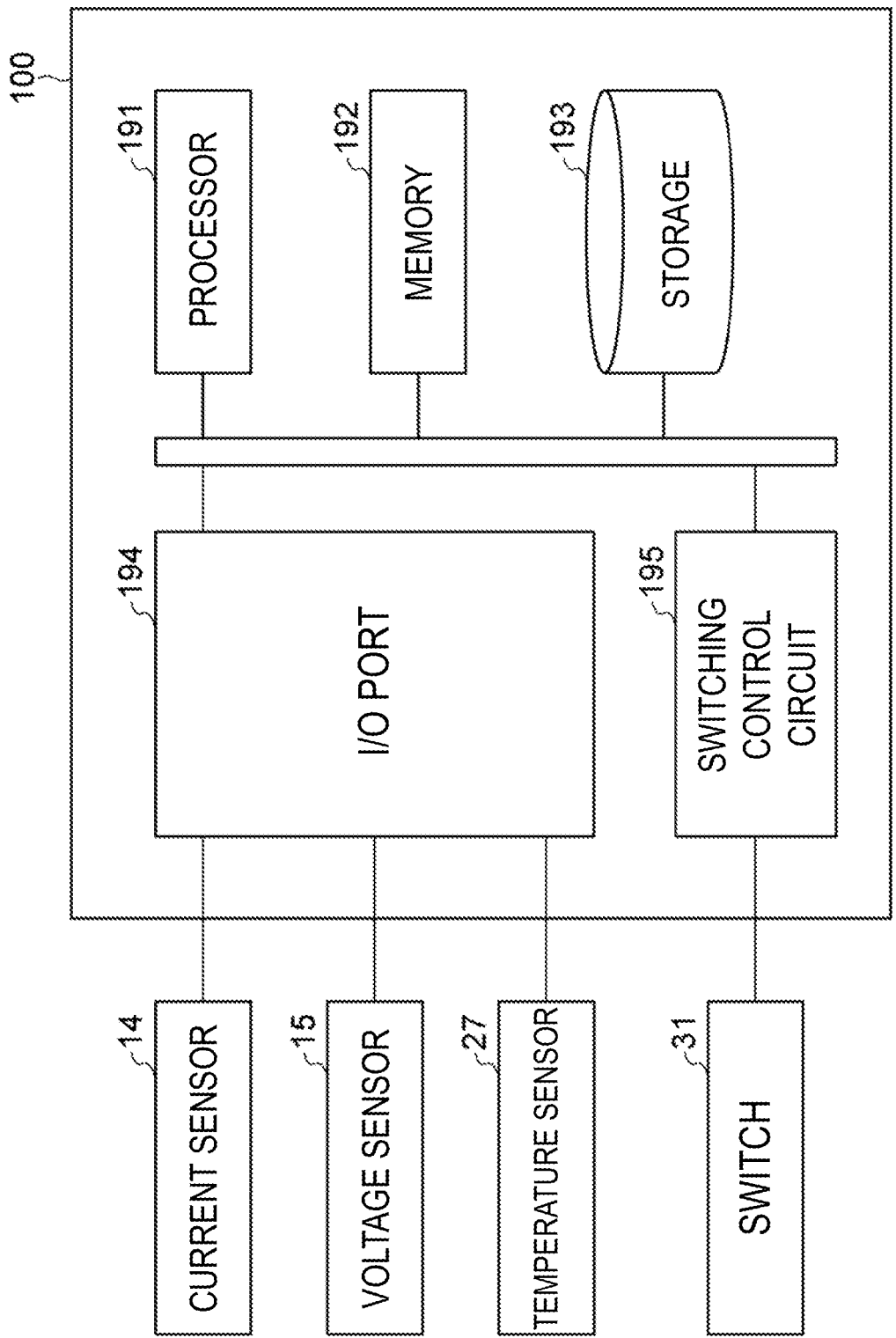
FIG. 7 is a block diagram illustrating an example of a hardware configuration of a control circuit.

FIG. 7 is a schematic diagram illustrating an example of the hardware configuration of the control circuit 100. As illustrated in FIG. 7, the control circuit 100 includes one or more processors 191, a memory 192, a storage 193, an I/O port 194, and a switching control circuit 195. The storage 193 includes a computer-readable storage medium such as a non-volatile semiconductor memory, for example. The storage 193 stores a program for causing the control circuit 100 to execute a temperature estimation method including: calculating the power loss in the switches 31 on the basis of the voltage applied between the terminals of the switches 31, the current flowing through the switches 31, and the on/off timing of the switches 31; correcting the power loss calculation result on the basis of the detection result of the temperature at the sensor position P27; correcting the detection result of the temperature at the sensor position P27 on the basis of the power loss calculation result; and estimating the temperature at the switch positions P31 on the basis of the corrected power loss calculation result and the corrected detection result of the temperature at the sensor position P27. For example, the storage 193 stores a program for implementing each of the functional blocks described above in the control circuit 100.

The memory 192 temporarily stores programs loaded from the storage medium of the storage 193 and calculation results from the processor 191. The processor 191 implements each functional block of the control circuit 100 by executing a program while using the memory 192. The I/O port 194 inputs and outputs information between the current sensor 14, the voltage sensor 15, the temperature sensor 27, and the switch 31 on the basis of commands from the processor 191. In accordance with commands from the processor 191, the switching control circuit 195 outputs, to the switching module 20, a drive signal for switching the switches 31 on and off.

Note that in the control circuit 100, the functions are not limited to being implemented by a program. For example, the control circuit 100 may implement at least one function by a dedicated logic circuit or an application specific integrated circuit (ASIC) integrated therewith.

Power Conversion Process

Next, as an example of the power conversion method, an example of a control process of the power conversion circuit 10 executed by the control circuit 100 will be described. The process includes a temperature estimation method including: calculating the power loss in the switches 31 on the basis of the voltage applied between the terminals of the switches 31, the current flowing through the switches 31, and the on/off timing of the switches 31; correcting the power loss calculation result on the basis of the detection result of the temperature at the sensor position P27; correcting the detection result of the temperature at the sensor position P27 on the basis of the power loss calculation result; and estimating the temperature at the switch positions P31 on the basis of the corrected power loss calculation result and the corrected detection result of the temperature at the sensor position P27. The example of the control process is described in detail below.

Figure 8:
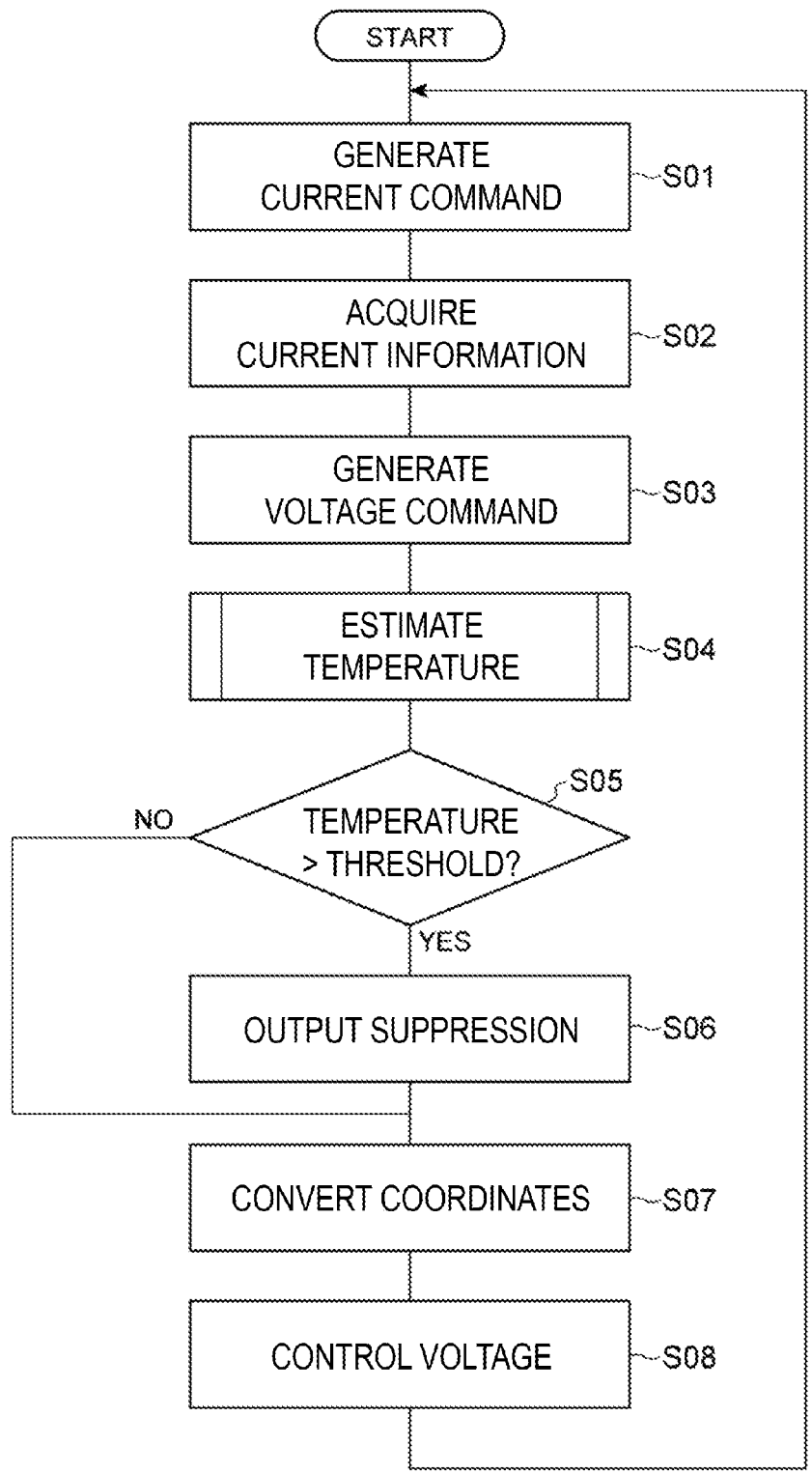
FIG. 8 is a flowchart illustrating an example of a power conversion control process.

As illustrated in FIG. 8, the control circuit 100 first executes steps S01, S02, S03, S04, and S05. In step S01, the current command generation unit 111 calculates the d-axis current command Id* and the q-axis current command Iq* on the basis of the torque command T*. In step S02, the current information acquisition unit 115 acquires the detection result from the current sensor 14 and calculates the d-axis current Id and the q-axis current Iq. In step S03, the voltage command generation unit 112 calculates the d-axis voltage command Vd* and the q-axis voltage command Vq* on the basis of the d-axis current command Id*, the q-axis current command Iq*, a d-axis current Id, and a q-axis current Iq so as to reduce the deviation between the d-axis current command Id* and the d-axis current Id and reduce the deviation between the q-axis current command Iq* and the q-axis current Iq.

In step S04, the temperature estimation unit 116 estimates the temperature at the switch positions P31. The specific process of step S04 is described below. In step S05, the output suppression unit 117 checks whether or not the temperature at the switch positions P31 exceeds a predetermined threshold.

In a case where, in step S05, the temperature at the switch positions P31 is determined to be above the threshold, the control circuit 100 executes step S06. In step S06, the output suppression unit 117 executes processing to cause the driving power to be suppressed via the PWM control unit 114. For example, the output suppression unit 117 causes the d-axis voltage command Vd* and the q-axis voltage command Vq* to be decreased.

Next, the control circuit 100 executes step S07. In a case where, in step S05, the temperature at the switch positions P31 is determined to not be above the threshold, the control circuit 100 executes step S07 without executing step S06. In step S07, the coordinate conversion unit 113, for the d-axis voltage command Vd* and the q-axis voltage command Vq*, performs a coordinate conversion from the dq coordinate system to the αβ coordinate system and a conversion from two phase to three phase and calculates a U phase voltage command Vu*, a V phase voltage command Vv*, and a W phase voltage command Vw*. In step S08, the PWM control unit 114 switches the plurality of switches 31 of the switching module 20 on and off such that drive voltages in accordance with the U phase voltage command Vu*, the V phase voltage command Vv*, and the W phase voltage command Vw* are applied to the motor 91. Then, the control circuit 100 returns the processing to step S01. The control process described above is then repeated.

Figure 9:
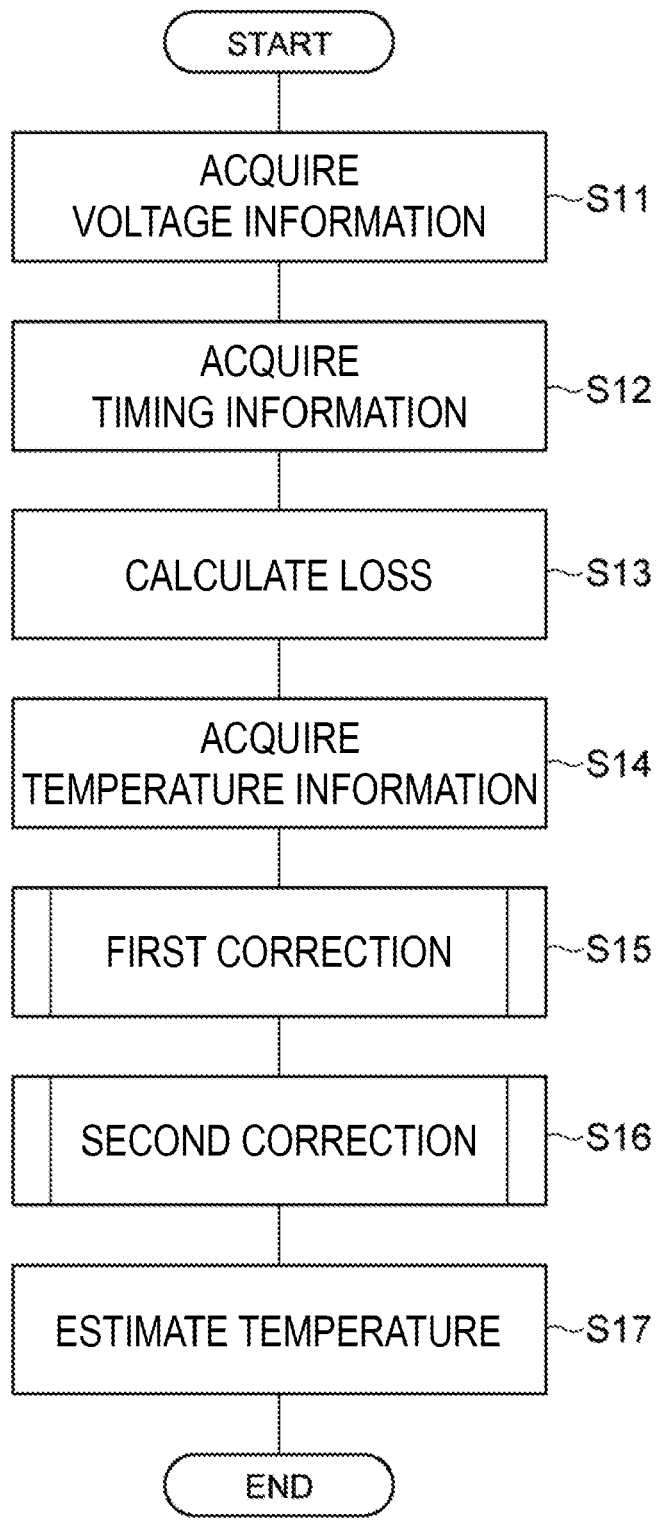
FIG. 9 is a flowchart illustrating an example of a temperature estimation process.

FIG. 9 is a flowchart illustrating an example of a temperature estimation process of step S04. As illustrated in FIG. 9, the control circuit 100 sequentially executes steps S11, S12, S13, S14, S15, S16, and S17. In step S11, the loss calculation unit 121 acquires the DC busbar voltage Vpn detected by the voltage sensor 15. In the step S12, the loss calculation unit 121 acquires information relating to the on/off timing of the switches 31 from the PWM control unit 114. In step S13, the loss calculation unit 121 calculates the loss calculation value Pj on the basis of the DC busbar voltage Vpn acquired in step S11, the U phase current Iu, the V phase current Iv, and the W phase current Iw obtained in step S02, and the on/off timing of the switches 31 acquired in step S12. In step S14, the temperature acquisition unit 122 acquires the temperature detection value Tt via the temperature sensor 27.

In step S15, the loss preliminary correction unit 146 performs preliminary correction on the loss calculation value Pj, and the temperature preliminary correction unit 147 performs preliminary correction on the temperature detection value Tt. The specific content of step S15 will be described below. In step S16, the loss correction unit 133 corrects the loss calculation value Pj, and the temperature correction unit 134 corrects the temperature detection value Tt. The specific content of step S16 will be described below. In step S17, the temperature estimation unit 116 estimates the temperature at the switch positions P31 on the basis of the loss calculation value Pj corrected by the loss correction unit 133 and the temperature detection value Tt corrected by the temperature correction unit 134. The temperature estimation process is thus completed.

Figure 10:
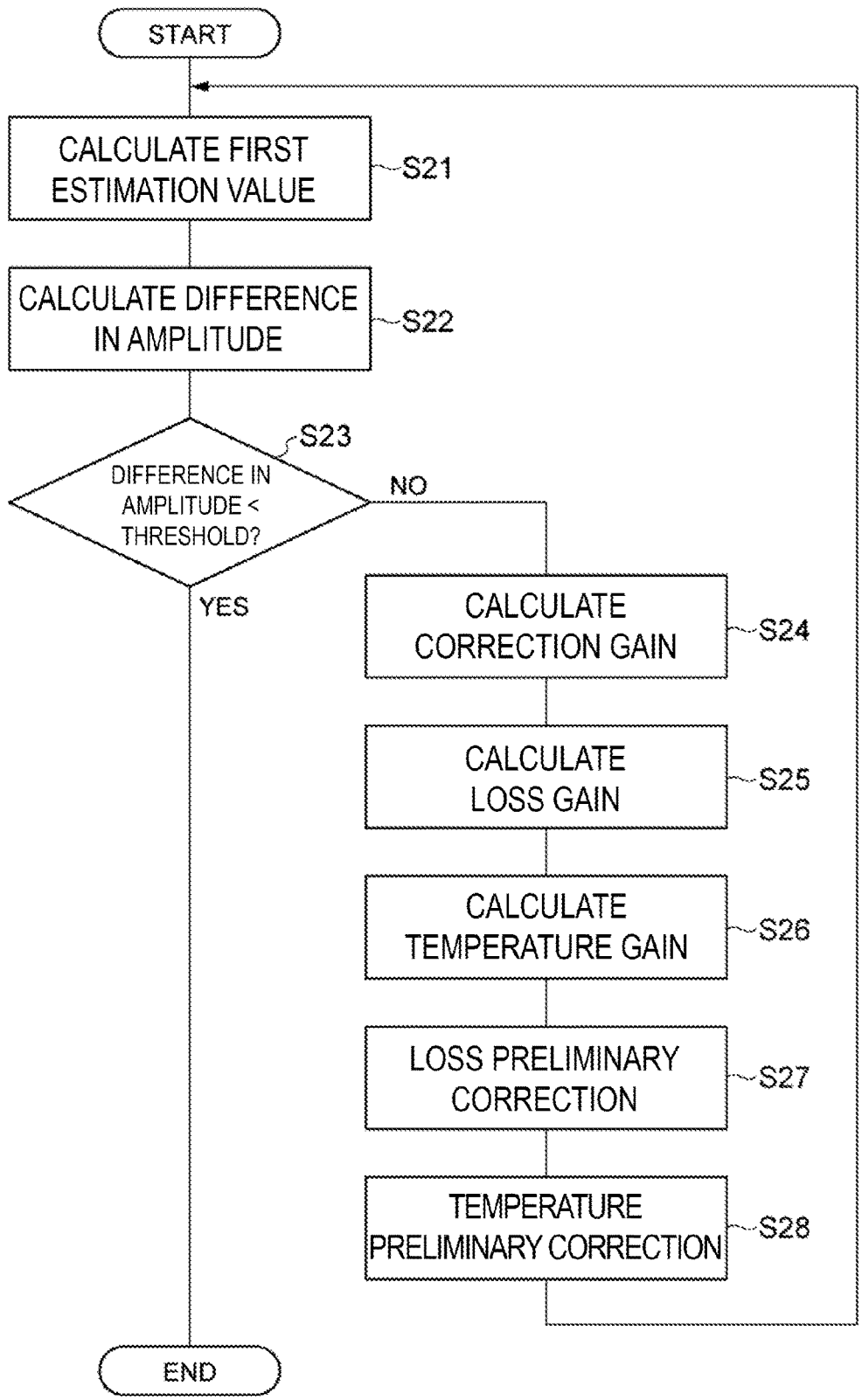
FIG. 10 is a flowchart illustrating an example of a preliminary correction process for a loss calculation result and a temperature detection result.

FIG. 10 is a flowchart illustrating an example of a preliminary correction process of step S15. As illustrated in FIG. 10, the control circuit 100 first executes steps S21, S22, and S23. In step S21, the first estimation unit 123 calculates the first estimation value ^Ttw on the basis of the loss calculation value Pj calculated by the loss calculation unit 121. In step S22, the fluctuation component calculation unit 141 calculates the fluctuation component of the difference on the basis of the first estimation value ^Ttw calculated in step S21 and the temperature detection value Tt acquired in step S14. In step S23, the correction gain calculation unit 142 checks whether or not the fluctuation component of the difference falls below a predetermined threshold.

In a case where, in step S23, the fluctuation component of the difference is determined to not be below the threshold, the control circuit 100 executes steps S24, S25, S26, S27, and S28. In step S24, the correction gain calculation unit 142 calculates a correction gain G0 for reducing the fluctuation component of the difference on the basis of the fluctuation component of the difference calculated in step S22. In step S25, the loss gain calculation unit 144 calculates a loss gain G1 for correcting the loss calculation value Pj on the basis of the first amplitude variation evaluation value, the second amplitude variation evaluation value, and the correction gain G0. In step S26, the temperature gain calculation unit 145 calculates a temperature gain G2 for correcting the temperature detection value Tt on the basis of the first amplitude variation evaluation value, the second amplitude variation evaluation value, and the correction gain G0.

In step S27, the loss preliminary correction unit 146 corrects the loss calculation value Pj by multiplying the loss calculation value Pj by the loss gain G1. In step S28, the temperature preliminary correction unit 147 corrects the temperature detection value Tt by multiplying the temperature detection value Tt by the temperature gain G2. Then, the control circuit 100 returns the processing to step S21. Thereafter, the preliminary correction of the loss calculation value Pj and the temperature detection value Tt is repeated until, in step S23, the fluctuation component of the difference is determined to be below the predetermined threshold. In a case where, in step S23, the fluctuation component of the difference is determined to be below the threshold, the preliminary correction of the loss calculation value Pj and the temperature detection value Tt is completed.

Figure 11:
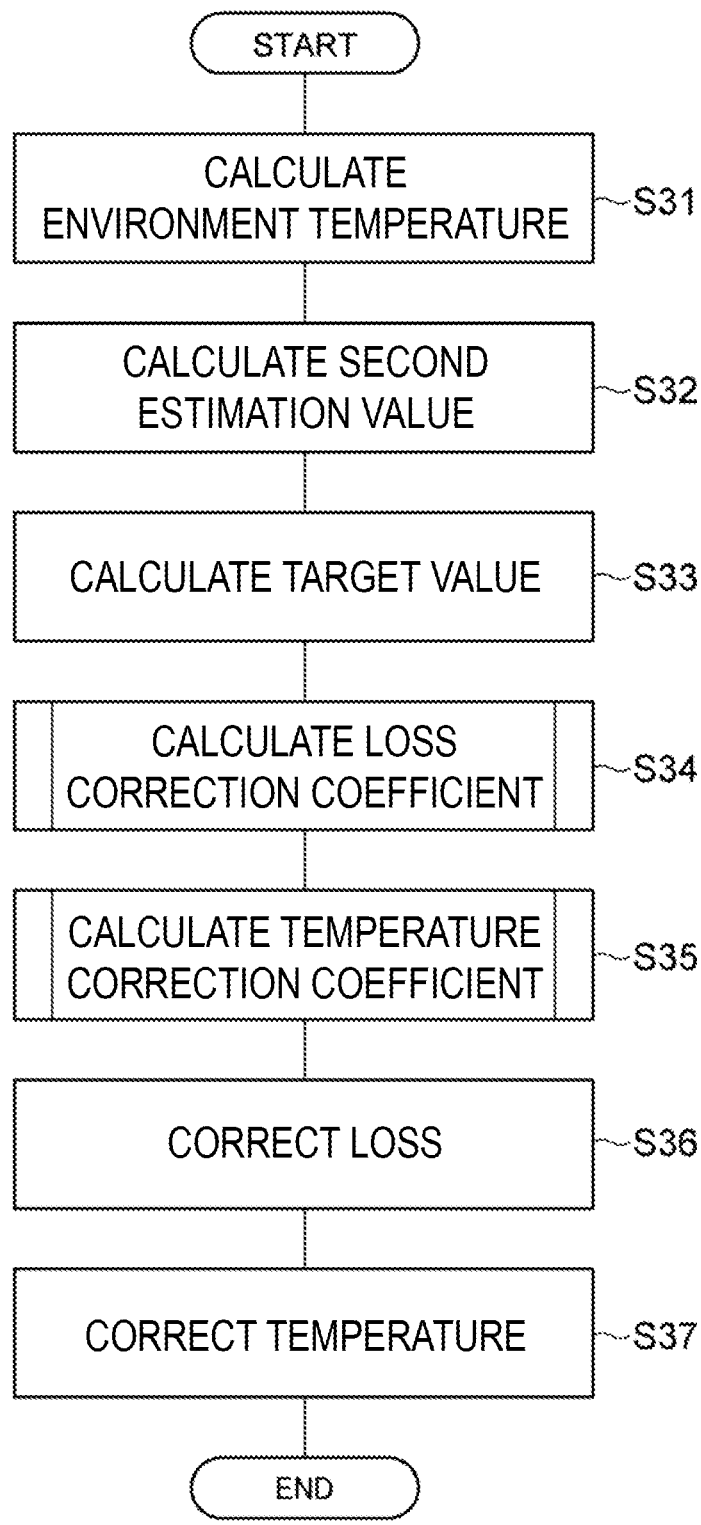
FIG. 11 is a flowchart illustrating an example of a correction process for a loss calculation result and a temperature detection result.

FIG. 11 is a flowchart illustrating an example of a correction process of step S16. The control circuit 100 sequentially executes steps S31, S32, S33, S34, S35, S36, and S37. In step S31, the environment temperature estimation unit 148 estimates the ambient environment temperature ^Tw on the basis of the loss calculation value Pj corrected by the loss preliminary correction unit 146 and the temperature detection value Tt corrected by the temperature preliminary correction unit 147. In step S32, the second estimation unit 124 calculates the second estimation value Ttw on the basis of the temperature detection value Tt corrected by the temperature preliminary correction unit 147 and the ambient environment temperature ^Tw estimated by the environment temperature estimation unit 148. In step S33, the target value calculation unit 125 calculates the temperature target value Tref on the basis of the first estimation value ^Ttw calculated in step S21 and the second estimation value Ttw calculated in step S32.

In step S34, the loss correction coefficient calculation unit 131 calculates a loss correction coefficient Kcp to cause the first estimation value ^Ttw to converge with the temperature target value Tref. The specific content of step S34 will be described below. In step S35, the temperature correction coefficient calculation unit 132 calculates a temperature correction coefficient Kct to cause the second estimation value Ttw to converge with the temperature target value Tref. The specific content of step S35 will be described below. In step S36, the loss correction unit 133 corrects the loss calculation value Pj by multiplying the loss calculation value Pj by the loss correction coefficient Kcp. In step S37, the temperature correction unit 134 corrects the temperature detection value Tt by multiplying the temperature detection value Tt by the temperature correction coefficient Kct. The correction process for the loss calculation value Pj and the temperature detection value Tt is thus completed.

Figure 12:
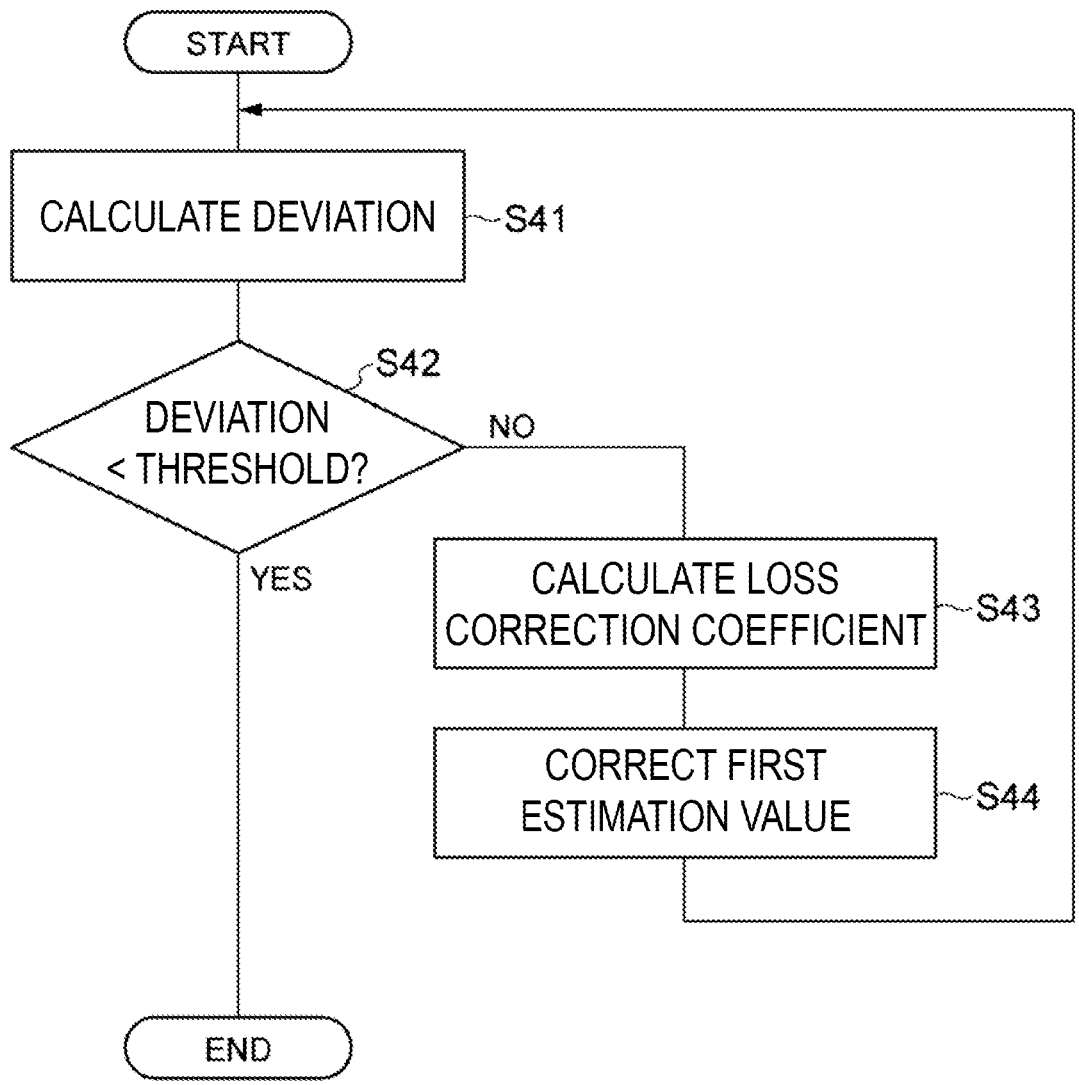
FIG. 12 is a flowchart illustrating an example of a calculation process for a loss correction coefficient.

FIG. 12 is a flowchart illustrating an example of the calculation process for the loss correction coefficient of step S34. The control circuit 100 first executes steps S41 and S42. In step S41, the loss correction coefficient calculation unit 131 calculates the deviation between the temperature target value Tref and the first estimation value ^Ttw. In step S42, the loss correction coefficient calculation unit 131 checks whether or not the deviation between the temperature target value Tref and the first estimation value ^Ttw is below a predetermined threshold.

In a case where, in step S42, the deviation between the temperature target value Tref and the first estimation value ^Ttw is determined to not be below the threshold, the control circuit 100 executes steps S43 and S44. In step S43, the loss correction coefficient calculation unit 131 calculates the correction factor by proportional/integral control applied to the deviation between the temperature target value Tref and the first estimation value ^Ttw and calculates the loss correction coefficient Kcp by adding together the correction factor and 1. In step S44, the loss correction coefficient calculation unit 131 corrects the first estimation value ^Ttw by multiplying the loss correction coefficient Kcp by the first estimation value ^Ttw. Then, the control circuit 100 returns the processing to step S41. Thereafter, the calculation of the loss correction coefficient Kcp and the correction of the first estimation value ^Ttw are repeated until the deviation between the temperature target value Tref and the first estimation value ^Ttw falls below the threshold. In a case where, in step S42, the deviation between the temperature target value Tref and the first estimation value ^Ttw is determined to be below the predetermined threshold, the calculation of the loss correction coefficient Kcp is completed.

Figure 13:
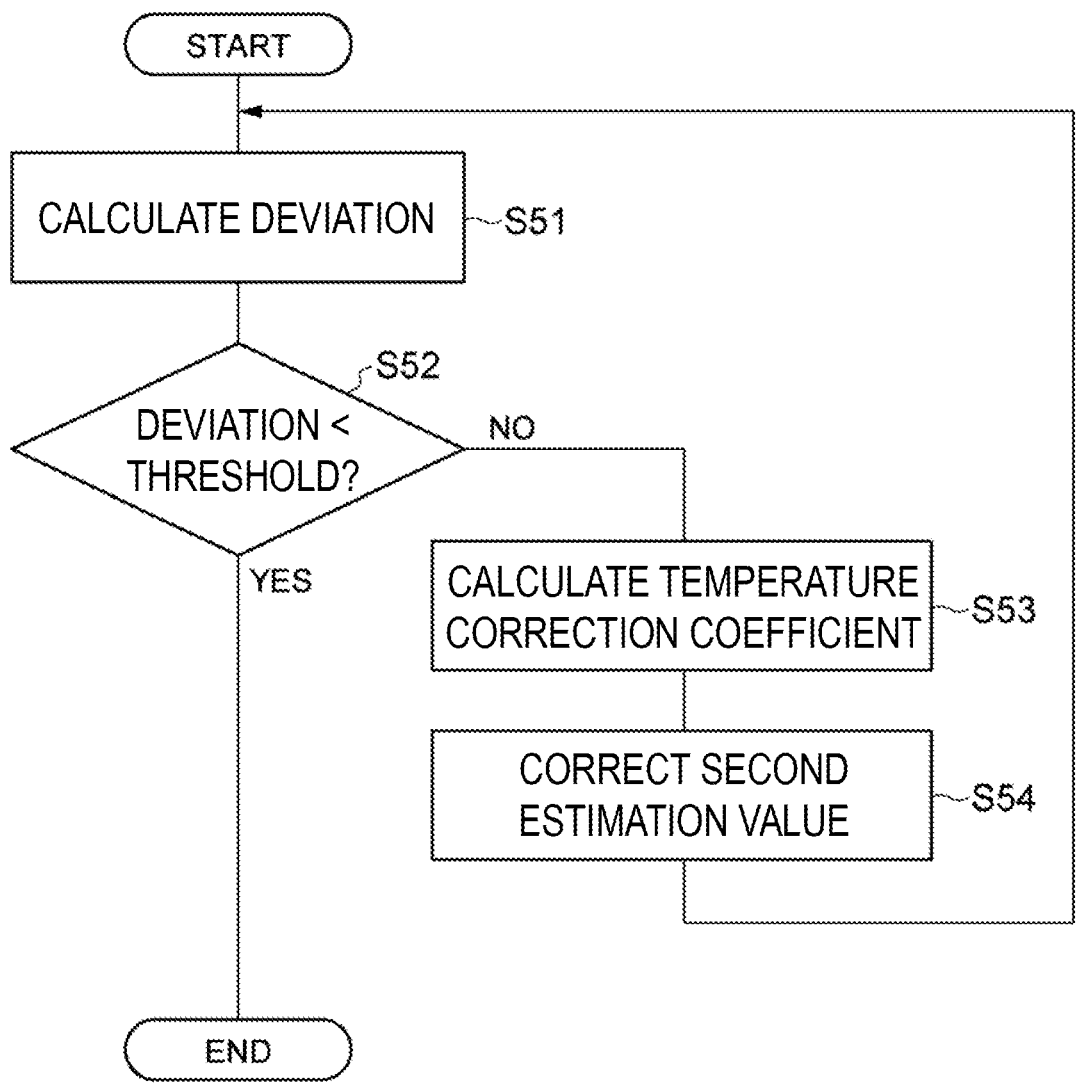
FIG. 13 is a flowchart illustrating an example of a calculation process for a temperature correction coefficient.

FIG. 13 is a flowchart illustrating an example of the calculation process for the temperature correction coefficient of step S35. The control circuit 100 first executes steps S51 and S52. In step S51, the temperature correction coefficient calculation unit 132 calculates the deviation between the temperature target value Tref and the second estimation value Ttw. In step S52, the temperature correction coefficient calculation unit 132 checks whether or not the deviation between the temperature target value Tref and the second estimation value Ttw is below a predetermined threshold.

In a case where, in step S52, the deviation between the temperature target value Tref and the second estimation value Ttw is determined to not be below the threshold, the control circuit 100 executes steps S53 and S54. In step S53, the temperature correction coefficient calculation unit 132 calculates the correction factor by proportional/integral control applied to the deviation between the temperature target value Tref and the second estimation value Ttw and calculates the temperature correction coefficient Kct by adding together the correction factor and 1. In step S54, the temperature correction coefficient calculation unit 132 corrects the second estimation value Ttw by multiplying the temperature correction coefficient Kct by the second estimation value Ttw. Then, the control circuit 100 returns the processing to step S51. Thereafter, the calculation of the temperature correction coefficient Kct and the correction of the second estimation value Ttw are repeated until the deviation between the temperature target value Tref and the second estimation value Ttw falls below the threshold. In a case where, in step S52, the deviation between the temperature target value Tref and the second estimation value Ttw is determined to be below the predetermined threshold, the calculation of the temperature correction coefficient Kct is completed.

Effects of the Present Embodiment

As described above, the power conversion device 1 includes the power conversion circuit 10 including the temperature sensor 27 configured to detect a temperature at the sensor position P27 and the switch 31 configured to switch a connection between the positive electrode line 16P and the negative electrode line 16N and the output lines 17U, 17V, 17W on and off at the switch position P31 separated from the sensor position P27; the loss calculation unit 121 configured to calculate a power loss in the switch 31 on the basis of a voltage applied between terminals of the switch 31, the current flowing through the switch 31, and on/off timing of the switch 31, the loss correction unit 133 configured to correct a calculation result of the power loss on the basis of a detection result of the temperature at the sensor position P27; the temperature correction unit 134 configured to correct the detection result of the temperature on the basis of the calculation result of the power loss, and the temperature estimation unit 116 configured to estimate a temperature at the switch position P31 on the basis of a corrected calculation result of the power loss and a corrected detection result of the temperature.

In estimating the temperature at the switch positions P31 on the basis of the temperature detection result and the power loss calculation result, both a temperature detection error and a power loss calculation error may occur. Regarding this, according to the power conversion device 1 of the present embodiment, the power loss calculation result is corrected on the basis of the temperature detection result, the temperature detection result is corrected on the basis of the power loss calculation result, and the temperature at the switch positions P31 is estimated on the basis of the corrected power loss calculation result and the corrected temperature detection result. Since the temperature at the sensor position P27 and the power loss in the switches 31 are correlated, by using the power loss calculation result, the temperature detection result can be appropriately corrected, and by using the temperature detection result, the power loss calculation result can be appropriately corrected. Accordingly, the temperature of the switches 31 of the power conversion circuit 10 can be estimated with higher accuracy. Note that the switch position P31 may be separated from the sensor position P27 by a distance at which the heat generation of the switch 31 influences the detection result of the temperature sensor 27. The loss calculation unit 121 may convert the voltage between the positive electrode line 16P and the negative electrode line 16N and the current of the output lines 17U, 17V, 17W into a voltage between the terminals of the switches 31 and a current flowing through the switches 31.

The power conversion device 1 may further include the first estimation unit 123 configured to calculate a first estimation value for a predetermined estimation target on the basis of the calculation result of the power loss and the second estimation unit 124 configured to calculate a second estimation value for the estimation target on the basis of the detection result of the temperature, wherein the loss correction unit 133 corrects the calculation result of the power loss so as to bring the first estimation value closer to the second estimation value, and the temperature correction unit 134 corrects the detection result of the temperature so as to bring the second estimation value closer to the first estimation value. In this case, in regard to the same estimation target, the first estimation value can be calculated on the basis of the power loss calculation result, the second estimation value can be calculated on the basis of the temperature detection result, and these can be compared, allowing the power loss calculation result and the temperature detection result to be easily corrected.

The power conversion device 1 may further include the variation storage unit 126 configured to store a first variation evaluation value that represents variation in the first estimation value under a predetermined condition and a second variation evaluation value that represents variation in the second estimation value under a predetermined condition, wherein the loss correction unit 133 corrects the calculation result of the power loss so as to reduce a component corresponding to the first variation evaluation value of a difference between the first estimation value and the second estimation value, and the temperature correction unit 134 corrects the detection result of the temperature so as to reduce a component corresponding to the second variation evaluation value of a difference between the first estimation value and the second estimation value. In this case, using the variation in the first estimation value and the variation in the second estimation value, the correction of the power loss calculation result by the loss correction unit 133 and the correction of the temperature detection result by the temperature correction unit 134 can be more appropriately combined, allowing the estimation accuracy of the temperature at the switch position P31 to be further improved.

The estimation target may be the temperature difference between the temperature at the sensor position P27 and the ambient environment temperature. In this case, the first estimation value and the second estimation value can be easily calculated.

The power conversion device 1 may further include the loss preliminary correction unit 146 configured to correct the calculation result of the power loss so as to bring a fluctuation component of the first estimation value closer to a fluctuation component of the second estimation value and the temperature preliminary correction unit 147 configured to correct the detection result of the temperature so as to bring the fluctuation component of the second estimation value closer to the fluctuation component of the first estimation value, wherein the first estimation unit 123 calculates the first estimation value on the basis of the calculation result of the power loss corrected by the loss preliminary correction unit 146, and the second estimation unit 124 calculates the second estimation value on the basis of the detection result of the temperature corrected by the temperature preliminary correction unit 147. In this case, mainly the gain component of the temperature estimation result of the switch position P31 is corrected by the loss preliminary correction unit 146 and the temperature preliminary correction unit 147, and mainly the stationary component of the temperature estimation result of the switch position P31 is corrected by the loss correction unit 133 and the temperature correction unit 134. In this manner, by individually correcting the fluctuation component and the stationary component, the accuracy of estimating the temperature at the switch position P31 can be further improved.

The power conversion device 1 may further include the amplitude variation storage unit 143 configured to store a first amplitude variation evaluation value that represents variation in an amplitude of the first estimation value under a predetermined condition and a second amplitude variation evaluation value that represents variation in an amplitude of the second estimation value under a predetermined condition, wherein the loss preliminary correction unit 146 corrects the calculation result of the power loss so as to reduce a component corresponding to the first amplitude variation evaluation value of a difference between the fluctuation component of the first estimation value and the fluctuation component of the second estimation value, and the temperature preliminary correction unit 147 corrects the detection result of the temperature so as to reduce a component corresponding to the second amplitude variation evaluation value of a difference between the fluctuation component of the first estimation value and the fluctuation component of the second estimation value. In this case, using the variation in the amplitude of the first estimation value and the variation in the amplitude of the second estimation value, the correction of the power loss calculation result by the loss preliminary correction unit 146 and the correction of the temperature detection result by the temperature preliminary correction unit 147 can be more appropriately combined, allowing the estimation accuracy of the temperature at the switch position P31 to be further improved.

The power conversion device 1 may further include the environment temperature estimation unit 148 configured to estimate the ambient environment temperature on the basis of the calculation result of the power loss corrected by the loss preliminary correction unit 146 and the detection result of the temperature corrected by the temperature preliminary correction unit 147, wherein the second estimation unit 124 calculates the second estimation value on the basis of the detection result of the temperature corrected by the temperature preliminary correction unit 147 and the ambient environment temperature estimated by the environment temperature estimation unit 148. In this case, since the ambient environment temperature can be estimated, the configuration of the device can be further simplified.

Embodiments have been described above. However, the present disclosure is not limited to the embodiments described above, and various modifications are possible without departing from the scope of the present disclosure.

While preferred embodiments of the invention have been described as above, it is to be understood that variations and modifications will be apparent to those skilled in the art without departing from the scope and spirit of the invention. The scope of the invention, therefore, is to be determined solely by the following claims.

The invention claimed is:

1. A power conversion device, comprising:
a power conversion circuit comprising
switching processing circuitry being connected to a primary line and a secondary line,
a temperature sensor configured to detect a temperature at a first position, and
a switch configured to switch a connection between the primary line and the secondary line on and off at a second position separated from the first position;
loss calculation processing circuitry configured to calculate a power loss in the switch on the basis of a voltage applied between terminals of the switch, a current flowing through the switch, and on/off timing of the switch;
loss correction processing circuitry configured to correct a calculation result of the power loss on the basis of a detection result of the temperature at the first position;
temperature correction processing circuitry configured to correct the detection result of the temperature on the basis of the calculation result of the power loss; and
temperature estimation processing circuitry configured to estimate a temperature at the second position on the basis of a corrected calculation result of the power loss and a corrected detection result of the temperature, wherein
the power conversion device further comprises
first estimation processing circuitry configured to calculate a first estimation value for a predetermined estimation target on the basis of the calculation result of the power loss; and
second estimation processing circuitry configured to calculate a second estimation value for the estimation target on the basis of the detection result of the temperature,
the loss correction processing circuitry corrects the calculation result of the power loss to bring the first estimation value closer to the second estimation value, and
the temperature correction processing circuitry corrects the detection result of the temperature to bring the second estimation value closer to the first estimation value.

2. The power conversion device according to claim 1, wherein
the second position is separated from the first position by a distance at which heat generation of the switch influences the detection result of the temperature sensor.

3. The power conversion device according to claim 2, wherein
the loss calculation processing circuitry converts a voltage of the primary line and a current of the secondary line into a voltage between the terminals of the switch and a current flowing through the switch.

4. The power conversion device according to claim 3, further comprising:
a variation storage configured to store a first variation evaluation value that represents variation in the first estimation value under a predetermined condition and a second variation evaluation value that represents variation in the second estimation value under a predetermined condition, wherein
the loss correction processing circuitry corrects the calculation result of the power loss to reduce a component corresponding to the first variation evaluation value of a difference between the first estimation value and the second estimation value, and the temperature correction processing circuitry corrects the detection result of the temperature to reduce a component corresponding to the second variation evaluation value of a difference between the first estimation value and the second estimation value.

5. The power conversion device according to claim 2, further comprising:

a variation storage configured to store a first variation evaluation value that represents variation in the first estimation value under a predetermined condition and a second variation evaluation value that represents variation in the second estimation value under a predetermined condition, wherein the loss correction processing circuitry corrects the calculation result of the power loss to reduce a component corresponding to the first variation evaluation value of a difference between the first estimation value and the second estimation value, and the temperature correction processing circuitry corrects the detection result of the temperature to reduce a component corresponding to the second variation evaluation value of a difference between the first estimation value and the second estimation value.

6. The power conversion device according to claim 2, wherein the estimation target is a temperature difference between a temperature at the first position and an ambient environment temperature.

7. The power conversion device according to claim 1, wherein the loss calculation processing circuitry converts a voltage of the primary line and a current of the secondary line into a voltage between the terminals of the switch and a current flowing through the switch.

8. The power conversion device according to claim 7, further comprising:

variation storage configured to store a first variation evaluation value that represents variation in the first estimation value under a predetermined condition and a second variation evaluation value that represents variation in the second estimation value under a predetermined condition, wherein the loss correction processing circuitry corrects the calculation result of the power loss to reduce a component corresponding to the first variation evaluation value of a difference between the first estimation value and the second estimation value, and the temperature correction processing circuitry corrects the detection result of the temperature to reduce a component corresponding to the second variation evaluation value of a difference between the first estimation value and the second estimation value.

9. The power conversion device according to claim 7, wherein the estimation target is a temperature difference between a temperature at the first position and an ambient environment temperature.

10. The power conversion device according to claim 1, further comprising:

a variation storage configured to store a first variation evaluation value that represents variation in the first estimation value under a predetermined condition and a second variation evaluation value that represents variation in the second estimation value under a predetermined condition, wherein the loss correction processing circuitry corrects the calculation result of the power loss to reduce a component corresponding to the first variation evaluation value of a difference between the first estimation value and the second estimation value, and the temperature correction processing circuitry corrects the detection result of the temperature to reduce a component corresponding to the second variation evaluation value of a difference between the first estimation value and the second estimation value.

11. The power conversion device according to claim 1, wherein the estimation target is a temperature difference between a temperature at the first position and an ambient environment temperature.

12. The power conversion device according to claim 11, further comprising:

loss preliminary correction processing circuitry configured to correct the calculation result of the power loss to bring a fluctuation component of the first estimation value closer to a fluctuation component of the second estimation value; and temperature preliminary correction processing circuitry configured to correct the detection result of the temperature to bring the fluctuation component of the second estimation value closer to the fluctuation component of the first estimation value, wherein the first estimation processing circuitry calculates the first estimation value on the basis of the calculation result of the power loss corrected by the loss preliminary correction processing circuitry, and the second estimation processing circuitry calculates the second estimation value on the basis of the detection result of the temperature corrected by the temperature preliminary correction processing circuitry.

13. The power conversion device according to claim 12, further comprising:

an amplitude variation storage configured to store a first amplitude variation evaluation value that represents variation in an amplitude of the first estimation value under a predetermined condition and a second amplitude variation evaluation value that represents variation in an amplitude of the second estimation value under a predetermined condition, wherein the loss preliminary correction processing circuitry corrects the calculation result of the power loss to reduce a component corresponding to the first amplitude variation evaluation value of a difference between the fluctuation component of the first estimation value and the fluctuation component of the second estimation value, and the temperature preliminary correction processing circuitry corrects the detection result of the temperature to reduce a component corresponding to the second amplitude variation evaluation value of a difference between the fluctuation component of the first estimation value and the fluctuation component of the second estimation value.

14. The power conversion device according to claim 13, further comprising:

environment temperature estimation processing circuitry configured to estimate the ambient environment temperature on the basis of the calculation result of the power loss corrected by the loss preliminary correction processing circuitry and the detection result of the temperature corrected by the temperature preliminary correction processing circuitry, wherein the second estimation processing circuitry calculates the second estimation value on the basis of the detection result of the temperature corrected by the temperature preliminary correction processing circuitry and the ambient environment temperature estimated by the environment temperature estimation processing circuitry.

15. A temperature estimation method in a power conversion circuit, the power conversion circuit comprising a switching processing circuitry being connected to a primary line and a secondary line, a temperature sensor configured to detect a temperature at a first position, and a switch configured to switch a connection between the primary line and the secondary line on and off at a second position separated from the first position, the temperature estimation method comprising:

calculating a power loss in the switch on the basis of a voltage applied between terminals of the switch, a current flowing through the switch, and on/off timing of the switch;

correcting a calculation result of the power loss on the basis of a detection result of the temperature at the first position;

correcting the detection result of the temperature on the basis of the calculation result of the power loss; and estimating a temperature at the second position on the basis of a corrected calculation result of the power loss and a corrected detection result of the temperature, wherein the temperature estimation method further comprises
calculating a first estimation value for a predetermined estimation target on the basis of the calculation result of the power loss; and
calculating a second estimation value for the estimation target on the basis of the detection result of the temperature, the correcting of the calculation result of the power loss corrects the calculation result of the power loss to bring the first estimation value closer to the second estimation value, and the correcting of the detection result of the temperature corrects the detection result of the temperature to bring the second estimation value closer to the first estimation value.

16. A non-transitory computer readable storage medium with an executable program recorded thereon for causing a device to execute a temperature estimation method in a power conversion circuit, the power conversion circuit comprising a switching processing circuitry being connected to a primary line and a secondary line, a temperature sensor configured to detect a temperature at a first position, and a switch configured to switch a connection between the primary line and the secondary line on and off at a second position separated from the first position, the temperature estimation method comprising:

calculating a power loss in the switch on the basis of a voltage applied between terminals of the switch, a current flowing through the switch, and on/off timing of the switch;

correcting a calculation result of the power loss on the basis of a detection result of the temperature at the first position;

correcting the detection result of the temperature on the basis of the calculation result of the power loss; and estimating a temperature at the second position on the basis of a corrected calculation result of the power loss and a corrected detection result of the temperature, wherein the temperature estimation method further comprises
calculating a first estimation value for a predetermined estimation target on the basis of the calculation result of the power loss; and
calculating a second estimation value for the estimation target on the basis of the detection result of the temperature, the correcting of the calculation result of the power loss corrects the calculation result of the power loss to bring the first estimation value closer to the second estimation value, and the correcting of the detection result of the temperature corrects the detection result of the temperature to bring the second estimation value closer to the first estimation value.

* * * * *